(12) United States Patent
Nagarajan

(10) Patent No.: US 9,166,704 B1
(45) Date of Patent: Oct. 20, 2015

(54) INTEGRATED CONTROL FOR SILICON PHOTONICS

(71) Applicant: INPHI CORPORATION, Santa Clara, CA (US)

(72) Inventor: Radhakrishnan Nagarajan, Santa Clara, CA (US)

(73) Assignee: Inphi Corporation, Santa Clara, CA (US)

( * ) Notice: Subject to any disclaimer, the term of this patent is extended or adjusted under 35 U.S.C. 154(b) by 0 days.

(21) Appl. No.: 14/323,254

(22) Filed: Jul. 3, 2014

Related U.S. Application Data

(60) Provisional application No. 61/847,523, filed on Jul. 17, 2013, provisional application No. 61/873,784, filed on Sep. 4, 2013.

(51) Int. Cl.
*H04B 10/04* (2006.01)
*H04B 10/70* (2013.01)
*H04B 10/079* (2013.01)
*H04J 14/02* (2006.01)

(52) U.S. Cl.
CPC .......... *H04B 10/70* (2013.01); *H04B 10/07955* (2013.01); *H04J 14/0221* (2013.01)

(58) Field of Classification Search
CPC .... H04B 10/564; H04B 10/572; H04B 10/58; H04B 10/504; H04B 10/505; H04B 10/506; H01S 5/0085; H01S 5/024; H01S 5/02415; H01S 5/02453; H01S 5/02461; H01S 5/026; H01S 5/0261; H01S 5/0264; H01S 5/0612; H01S 5/0683

USPC .......... 398/192, 196, 197, 164, 140, 158, 94, 398/95

See application file for complete search history.

(56) References Cited

U.S. PATENT DOCUMENTS

| | | | | |
|---|---|---|---|---|
| 7,426,350 | B1 * | 9/2008 | Sun et al. ................ | 398/193 |
| 8,184,929 | B2 * | 5/2012 | Kish et al. ................. | 385/1 |
| 8,208,507 | B2 * | 6/2012 | Lerner et al. ............... | 372/34 |
| 8,666,257 | B2 * | 3/2014 | Daghighian et al. ........ | 398/138 |
| 8,831,437 | B2 * | 9/2014 | Dobbelaere et al. ........ | 398/164 |
| 8,903,254 | B2 * | 12/2014 | Hu et al. .................... | 398/192 |
| 8,989,587 | B2 * | 3/2015 | Rope et al. ................. | 398/135 |
| 9,006,740 | B1 * | 4/2015 | Nagarajan ................... | 257/48 |
| 2004/0161248 | A1 * | 8/2004 | Stewart et al. .............. | 398/196 |
| 2009/0022500 | A1 * | 1/2009 | Pinguet et al. ............. | 398/164 |
| 2010/0290790 | A1 * | 11/2010 | Murthy et al. ............. | 398/192 |
| 2011/0013911 | A1 * | 1/2011 | Alexander et al. .......... | 398/79 |
| 2011/0267676 | A1 * | 11/2011 | Dallesasse et al. ......... | 359/279 |

* cited by examiner

*Primary Examiner* — Hibret Woldekidan
(74) *Attorney, Agent, or Firm* — Richard T. Ogawa; Ogawa P.C.

(57) ABSTRACT

In an example, the present invention includes an integrated system on chip device. The device is configured on a single silicon substrate member. The device has a data input/output interface provided on the substrate member. The device has an input/output block provided on the substrate member and coupled to the data input/output interface. The device has a signal processing block provided on the substrate member and coupled to the input/output block. The device has a driver module provided on the substrate member and coupled to the signal processing block. In an example, the device has a driver interface provided on the substrate member and coupled to the driver module and configured to be coupled to a silicon photonics device. The device also has an interface configured to communicate between the silicon photonics device and the control block.

26 Claims, 20 Drawing Sheets

INTEGRATED CONTROL FOR SILICON PHOTONICS

CROSS-REFERENCE TO RELATED APPLICATIONS

This application claims priority to U.S. Provisional Application No. 61/847,523, filed Jul. 17, 2013, and also claims priority to U.S. Provisional Application No. 61/873,784, filed Sep. 4, 2013, commonly assigned and incorporated by reference herein for all purposes.

BACKGROUND OF THE INVENTION

The present invention relates to telecommunication techniques. More particularly, the present invention provides an integrated electrical optics multiple chip module and methods.

Over the last few decades, the use of communication networks exploded. In the early days Internet, popular applications were limited to emails, bulletin board, and mostly informational and text-based web page surfing, and the amount of data transferred was usually relatively small. Today, Internet and mobile applications demand a huge amount of bandwidth for transferring photo, video, music, and other multimedia files. For example, a social network like Facebook processes more than 500 TB of data daily. With such high demands on data and data transfer, existing data communication systems need to be improved to address these needs.

Over the past, there have been many types of communication systems and methods. Unfortunately, they have been inadequate for various applications. Therefore, improved communication systems and methods are desired.

BRIEF SUMMARY OF THE INVENTION

The present invention relates to telecommunication techniques. More specifically, various embodiments of the present invention provide a communication interface that is configured to transfer data at high bandwidth over optical communication networks. In certain embodiments, the communication interface is used by various devices, such as spine switches and leaf switches, within a spine-leaf network architecture, which allows large amount of data to be shared among servers.

In modern electrical interconnect systems, high-speed serial links have replaced parallel data buses, and serial link speed is rapidly increasing due to the evolution of CMOS technology. Internet bandwidth doubles almost every two years following Moore's Law. But Moore's Law is coming to an end in the next decade. Standard CMOS silicon transistors will stop scaling around 5 nm. And the internet bandwidth increasing due to process scaling will plateau. But Internet and mobile applications continuously demand a huge amount of bandwidth for transferring photo, video, music, and other multimedia files. This disclosure describes techniques and methods to improve the communication bandwidth beyond Moore's law.

Serial link performance is limited by the channel electrical bandwidth and the electronic components. In order to resolve the inter-symbol interference (ISI) problems caused by bandwidth limitations, we need to bring all electrical components as close as possible to reduce the distance or channel length among them. Stacking chips into so-called 3-D ICs promises a one-time boost in their capabilities, but it's very expensive. Another way to achieve this goal in this disclosure is to use multiple chip module technology.

In an example, an alternative method to increase the bandwidth is to move the optical devices close to electrical device. Silicon photonics is an important technology for moving optics closer to silicon. In this patent application, we will disclose a high speed electrical optics multiple chip module device to achieve terabits per second speed, as well as variations thereof.

In an alternative example, the present invention includes an integrated system on chip device. The device is configured on a single silicon substrate member. The device has a data input/output interface provided on the substrate member and configured for a predefined data rate and protocol. The device has an input/output block provided on the substrate member and coupled to the data input/output interface. In an example, the input/output block comprises a Serializer/Deserializer (SerDes) block, a clock data recovery (CDR) block, a compensation block, and an equalizer block, among others. The device has a signal processing block provided on the substrate member and coupled to the input/output block. In an example, the signal processing block is configured to the input/output block using a bi-direction bus in an intermediary protocol. The device has a driver module provided on the substrate member and coupled to the signal processing block. In an example, the driver module is coupled to the signal processing block using a uni-directional multi-lane bus. In an example, the device has a driver interface provided on the substrate member and coupled to the driver module and configured to be coupled to a silicon photonics device. In an example, the driver interface is configured to transmit output data in either an amplitude modulation format or a combination of phase/amplitude modulation format or a phase modulation format. In an example, the device has a receiver module comprising a transimpedance amplifier (TIA) block provided on the substrate member and to be coupled to the silicon photonics device using predefined modulation format, and configured to the signal processing block to communicate information to the input/output block for transmission through the data input/output interface. In an example, the device has a communication block provided on the substrate member and operably coupled to the input/output block, the signal processing block, the driver block, and the receiver block, among others. The device has a communication interface coupled to the communication block. The device has a control block provided on the substrate member and coupled to the communication block.

In an example, the signal processing block comprises a forward error correction (FEC) block, a digital signal processing block, a framing block, a protocol block, and a redundancy block, among others. The driver module is selected from a current drive or a voltage driver in an example. In an example, the driver module is a differential driver or the like. In an example, the silicon photonics device is selected from an electro absorption modulator (EAM) or electro optic modulator (EOM), or a Mach-Zehnder modulator (MZM). In an example, the amplified modulation format is selected from non-return to zero (NRZ) format or pulse amplitude modulation (PAM) format. In an example, the phase modulation format is selected from binary phase shift keying (BPSK) or nPSK. In an example, the phase/amplitude modulation is quad amplitude modulation (QAM). In an example, the silicon photonic device is configured to convert the output data into an output transport data in a wave division multiplexed (WDM) signal. In an example, the control block is configured to initiate a laser bias or a modulator bias. In an example, the control block is configured for laser bias and power control of the silicon photonics device. In an example, the control block is configured with a thermal tuning or carrier tuning device each of which is configured on the silicon photonics device. In an example, the SerDes block is configured to convert a first data stream of N into a second data stream of M.

In an example, the invention provides an integrated system on chip device. The device has a single silicon substrate member and a data input/output interface provided on the substrate member and configured for a predefined data rate and protocol. In an example, the device has an input/output block provided on the substrate member and coupled to the data input/output interface. The input/output block comprises a SerDes block, a CDR block, a compensation block, and an equalizer block, among others. The device has a signal processing block provided on the substrate member and coupled to the input/output block. In an example, the signal processing block is configured to the input/output block using a bi-direction bus in an intermediary protocol. In an example, the device has a driver module provided on the substrate member and coupled to the signal processing block. The driver module is coupled to the signal processing block using a uni-directional multi-lane bus. In an example, the device has a driver interface provided on the substrate member and coupled to the driver module and configured to be coupled to a silicon photonics device. The driver interface is configured to transmit output data in either an amplitude modulation format or a combination of phase/amplitude modulation format or a phase modulation format in an example. The device has a receiver module comprising a TIA block provided on the substrate member and to be coupled to the silicon photonics device using predefined modulation format, and configured to the signal processing block to communicate information to the input/output block for transmission through the data input/output interface. In an example, the device has a communication block provided on the substrate member and operably coupled to the input/output block and the signal processing block, the driver block, and the receiver block, and others, although there may be variations. In an example, the device has a communication interface coupled to the communication block and a control block provided on the substrate member and coupled to the communication block. In an example, the control block is configured to receive and send instruction(s) in a digital format to the communication block and being configured to receive and send signals in an analog format to communicate with the silicon photonics device.

In an example, the present invention provides a monolithically integrated system on chip device configured for a multi-rate and selected format of data communication. In an example, the device has a single silicon substrate member. The device has a data input/output interface provided on the substrate member and configured for a predefined data rate and protocol. In an example, the data input/output interface is configured for number of lanes numbered from four to one hundred and fifty. The device has an input/output block provided on the substrate member and coupled to the data input/output interface, which has a SerDes block, a CDR block, a compensation block, and an equalizer block. In an example, the SerDes block is configured to convert a first data stream of N into a second data stream of M. In an example, each of the first data stream has a first predefined data rate at a first clock rate and each of the second data stream having a second predefined data rate at a second clock rate. As used herein the terms "first" and "second" do not necessarily imply order and shall be construed broadly according to ordinary meaning. In an example, the device has a signal processing block provided on the substrate member and coupled to the input/output block. The signal processing block is configured to the input/output block using a bi-direction bus in an intermediary protocol in an example. The device has a driver module provided on the substrate member and coupled to the signal processing block. In an example, the driver module is coupled to the signal processing block using a uni-directional multi-lane bus. In an example, the device has a driver interface provided on the substrate member and coupled to the driver module and configured to be coupled to a silicon photonics device. In an example, the driver interface is configured to transmit output data in either an amplitude modulation format or a combination of phase/amplitude modulation format or a phase modulation format. The device has a receiver module comprising a TIA block provided on the substrate member and to be coupled to the silicon photonics device using predefined modulation format, and is configured to the signal processing block to communicate information to the input/output block for transmission through the data input/output interface. In an example, the device has a communication block provided on the substrate member and operably coupled to the input/output block, the signal processing block, the driver block, and the receiver block, and others, although there can be variations. In an example, the device has a communication interface coupled to the communication block and a control block provided on the substrate member and coupled to the communication block.

In an example, the present invention provides a monolithically integrated system on chip device configured for a multi-rate and selected format of data communication. In an example, the device has a single silicon substrate member. The device has a data input/output interface provided on the substrate member and configured for a predefined data rate and protocol. In an example, the data input/output interface is configured for number of lanes numbered from four to one hundred and fifty, although there can be variations. In an example, the device has an input/output block provided on the substrate member and coupled to the data input/output interface. In an example, the input/output block comprises a SerDes block, a CDR block, a compensation block, and an equalizer block, among others. In an example, the SerDes block is configured to convert a first data stream of X into a second data stream of Y, where X and Y are different integers. Each of the first data stream has a first predefined data rate at a first clock rate and each of the second data stream has a second predefined data rate at a second clock rate in an example. In an example, the device has a signal processing block provided on the substrate member and coupled to the input/output block. In an example, the signal processing block is configured to the input/output block using a bi-direction bus in an intermediary protocol. In an example, the device has a driver module provided on the substrate member and coupled to the signal processing block. In an example, the driver module is coupled to the signal processing block using a uni-directional multi-lane bus configured with N lanes, whereupon N is greater than M such that a difference between N and M represents a redundant lane or lanes. In an example, the device has a mapping block configured to associate the M lanes to a plurality of selected laser devices for a silicon photonics device. The device also has a driver interface provided on the substrate member and coupled to the driver module and configured to be coupled to the silicon photonics device. In an example, the driver interface is configured to transmit output data in either an amplitude modulation format or a combination of phase/amplitude modulation format or a phase modulation format. In an example, the device has a receiver module comprising a TIA block provided on the substrate member and to be coupled to the silicon photonics device using predefined modulation format, and configured to the signal processing block to communicate information to the input/output block for transmission through the data input/output interface. The device has a communication block provided on the substrate member and operably coupled to the input/output block, the signal processing block, the driver block, and the receiver block, among others. The device has a communication interface coupled to the communication block and a control block provided on the substrate member and coupled to the communication block.

In an example, the device has an integrated system on chip device. The device has a single silicon substrate member and a data input/output interface provided on the substrate member and configured for a predefined data rate and protocol. In an example, the device has an input/output block provided on the substrate member and coupled to the data input/output interface. In an example, the input/output block comprises a SerDes block, a CDR block, a compensation block, and an equalizer block, among others. The device has a signal processing block provided on the substrate member and coupled to the input/output block. The signal processing block is configured to the input/output block using a bi-direction bus in an intermediary protocol. The device has a driver module provided on the substrate member and coupled to the signal processing block. In an example, the driver module is coupled to the signal processing block using a uni-directional multi-lane bus. In an example, the device has a driver interface provided on the substrate member and coupled to the driver module and configured to be coupled to a silicon photonics device. In an example, the driver interface is configured to transmit output data in either an amplitude modulation format or a combination of phase/amplitude modulation format or a phase modulation format. In an example, the device has a receiver module comprising a TIA block provided on the substrate member and to be coupled to the silicon photonics device using predefined modulation format, and configured to the signal processing block to communicate information to the input/output block for transmission through the data input/output interface. In an example, the device has a communication block provided on the substrate member and operably coupled to the input/output block, the signal processing block, the driver block, and the receiver block, and among others. The device has a communication interface coupled to the communication block and a control block provided on the substrate member and coupled to the communication block. In an example, the device has a variable bias block configured with the control block. In an example, the variable bias block is configured to selectively tune each of a plurality of laser devices provided on the silicon photonics device to adjust for at least a wavelength of operation, a fabrication tolerance, and an extinction ratio.

In an example, the present invention provides an integrated system on chip device having a self test using a loop back technique. In an example, the device has a self-test block provided on the substrate, the self test block being configured to receive a loop back signal from at least one of the digital signal processing block, the driver module, or the silicon photonics device. In an example, the self test block comprises a variable output power switch configured to provide a stress receiver test from the loop back signal.

In an example, the invention provides an integrated system on chip device having a redundant laser or lasers configured for each channel. In an example, the device has a plurality of laser devices configured on the silicon photonics device. At least a pair of laser devices is associated with a channel and coupled to a switch to select one of the pair of laser devices to be coupled to an optical multiplexer to provide for a redundant laser device.

In an example, the present invention provides an integrated system on chip device having a built-in self test technique. In an example, the device has a self test block configured on the silicon photonics device and to be operable during a test operation. In an example, the self test block comprises a broad band source configured to emit electromagnetic radiation from 1200 nm to 1400 nm or 1500 to 1600 nm to a multiplexer device. In an example, the broad band source can be an LED or other suitable device. The device also includes a self test output configured to a spectrum analyzer device external to the silicon photonics device.

The present invention achieves these benefits and others in the context of known memory technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

Figure 1:
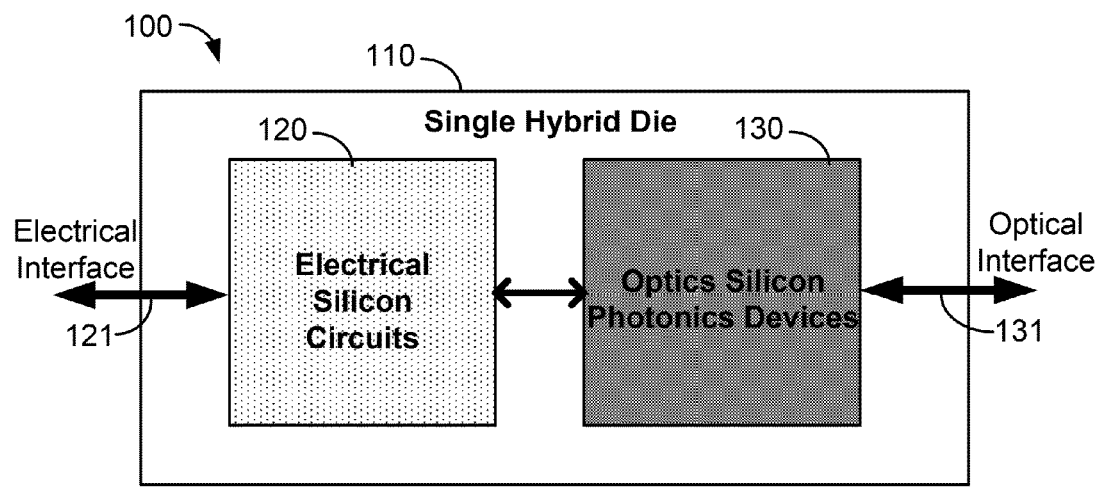
FIG. 1 is a simplified diagram of a single hybrid die (Both electrical and optics devices are fabricated on a single hybrid die) according to an embodiment of the present invention.

This present invention relates to telecommunication techniques. More specifically, various embodiments of the present invention provide a communication interface that is configured to transfer data at high bandwidth over optical communication networks. In certain embodiments, the communication interface is used by various devices, such as spine switches and leaf switches, within a spine-leaf network architecture, which allows large amount of data to be shared among servers.

In the last decades, with advent of cloud computing and data center, the needs for network servers have evolved. For example, the three-level configuration that have been used for a long time is no longer adequate or suitable, as distributed applications require flatter network architectures, where server virtualization that allows servers to operate in parallel. For example, multiple servers can be used together to perform a requested task. For multiple servers to work in parallel, it is often imperative for them to be share large amount of information among themselves quickly, as opposed to having data going back forth through multiple layers of network architecture (e.g., network switches, etc.).

Leaf-spine type of network architecture is provided to better allow servers to work in parallel and move data quickly among servers, offering high bandwidth and low latencies. Typically, a leaf-spine network architecture uses a top-of-rack switch that can directly access into server nodes and links back to a set of non-blocking spine switches that have enough bandwidth to allow for clusters of servers to be linked to one another and share large amount of data.

In a typical leaf-spine network today, gigabits of data are shared among servers. In certain network architectures, network servers on the same level have certain peer links for data sharing. Unfortunately, the bandwidth for this type of set up is often inadequate. It is to be appreciated that embodiments of the present invention utilizes PAM (e.g., PAM8, PAM12, PAM16, etc.) in leaf-spine architecture that allows large amount (up terabytes of data at the spine level) of data to be transferred via optical network.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

FIG. 1 is a simplified diagram of a single hybrid die (Both electrical and optics devices are fabricated on a single hybrid die) according to an embodiment of the present invention. In an example, the present device 100 comprises a single hybrid communication module made of silicon material. The module comprises a substrate member 110 having a surface region, an electrical silicon chip 120 overlying a first portion of the surface region, an silicon photonics device 130 overlying a second portion of the surface region, a communication bus coupled between the electrical silicon chip and the silicon photonics device, an optical interface 131 coupled to the silicon photonics device 130, and an electrical interface 121 coupled to the electrical silicon die 120.

Figure 2:
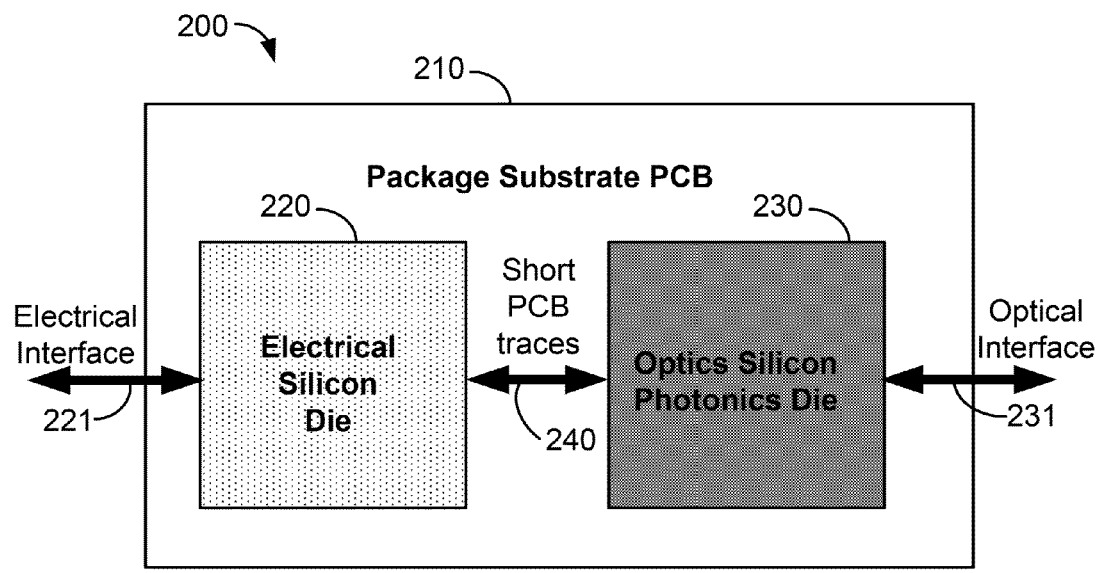
FIG. 2 is a simplified diagram of a multi-chip module according to an embodiment of the present invention.

FIG. 2 is a simplified diagram of a multi-chip module according to an embodiment of the present invention. In an example, the present device 200 comprises a single hybrid communication module. The module comprises a substrate member 210 having a surface region, which can be a printed circuit board or other member. The module comprises an electrical silicon chip 220 overlying a first portion of the surface region, a silicon photonics device 230 overlying a second portion of the surface region, a communication bus 240 coupled between the electrical silicon chip and the silicon photonics device, an optical interface 231 coupled to the silicon photonics device 230, and an electrical interface 221 coupled to the electrical silicon die 220.

Figure 2A:
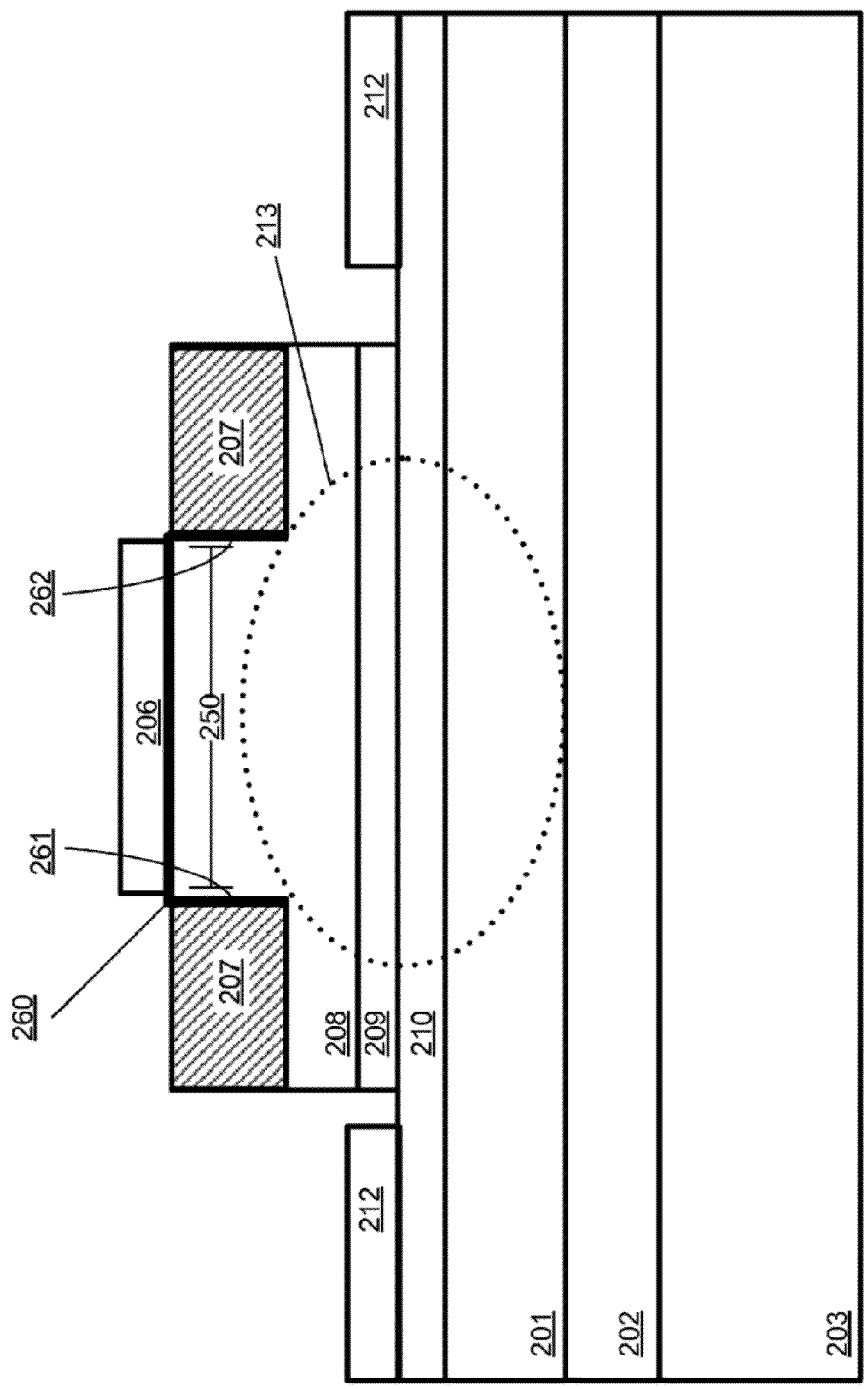
FIG. 2A is a simplified diagram of an exemplary hybrid silicon photonics device.

As shown in FIG. 1, the single hybrid die includes a hybrid silicon photonics device having an electrical circuit for processing and control and a silicon photonics module. In an example, the hybrid silicon photonics device is described in U.S. Pat. No. 8,380,033, in the name of Fang, et al. issued Feb. 19, 2013, hereby incorporated by reference. FIG. 2A shows a simplified block diagram of an exemplary hybrid silicon photonics device.

In this example, electro-optic device 200 includes a silicon semiconductor slab including silicon top layer 201, vertical confinement layer 202 and silicon substrate 203. Alternatively, substrate layer 203 may be a diamond substrate, a glass substrate, or any functional equivalent. Vertical confinement layer 202 may be formed of any dielectric material suitable for confining an optical mode (e.g., layer 201 may be a silicon dioxide layer, a silicon nitride layer, or any functionally equivalent insulating layer with a refractive index lower than silicon top layer 201).

Device 200 further includes a III-V semiconductor slab including p-type layer 208, active layer 209 and n-type layer 210 (thereby forming a P-I-N diode). The term "p-type layer," as used herein, describes a layer comprising a material that has more positive carriers (i.e., holes) than negative carriers (i.e., electrons). The term "n-type layer," as used herein, describes a layer comprising a material that has more negative carriers than positive carriers.

Alternatively, layer 208 may be an n-type layer, and layer 210 may be a p-type layer. Or, layers 208 and 210 may be n-type layers, while active region 209 may include a tunnel junction to convert n-type majority carriers to p-type majority carriers. This avoids the associated optical and microwave loss of p-type materials due to the use of p-dopants.

III-V semiconductor materials have elements that are found in group III and group V of the periodic table (e.g., Indium Gallium Arsenide Phosphide, Gallium Indium Arsenide Nitride). The carrier dispersion effects of III-V based materials may be significantly higher than in silicon based materials for bandgaps closer to the wavelength of the light being transmitted or modulated, as electron speed in III-V semiconductors is much faster than that in silicon. In addition, III-V materials have a direct bandgap which is required for the most efficient creation of light from electrical pumping. Thus, III-V semiconductor materials enable photonic operations with an increased efficiency over silicon for both generating light and modulating the refractive index of light.

Active layer 209 is of a III-V semiconductor with high electro-optic efficiency, i.e., the absorption coefficient (i.e., the imaginary portion of the complex refractive index) and the refractive index (i.e., the real portion of the complex refractive index) of active layer 209 is easily affected by either the Franz Kheldysh effect if active layer 209 comprises bulk material (e.g., intrinsic Indium Gallium Arsenide Phosphide or Indium Aluminum Gallium Arsenide or the Quantum Confined Stark Effect if active layer 209 comprises multiple quantum wells.

Optical waveguide 250 is formed by ridge 260 (which is "bolded" or "thicker" in the figure for illustrative purposes only), including ridge sides 261 and 262. It is clear that in this embodiment, waveguide 250 is formed by features in the III-V region of device 200 as opposed to being formed by features in the silicon region of the device, wherein waveguide is formed by voids included in silicon top region. Thus, the silicon and III-V regions of device 200 have a greater contact area than devices in the prior art (where layer 210 was continuously coupled to layer 201).

Overclad regions 207 may be formed on the device to improve mechanical stability, and may be of any material used to form vertical confinement layer 202 or any material with a lower refractive index than layer 208. Overclad regions 207 further provide vertical optical confinement and passivation as described below. The areas adjacent to ridge sides 261 and 262 provide optical confinement if left as voids (i.e., areas comprising air), but that forming overclad regions 207 provides for mechanical stability in addition to optical confinement.

Thus, optical mode 213 is vertically confined by vertical confinement layer 202, ridge 260 and overclad regions 207 while being laterally confined by ridge sides 261 and 262. Said ridge sides also confine injection current from electrode 206 towards the portion of active layer 209 that overlaps optical mode 213. The need for the etched regions and implanted regions is eliminated in the example shown above.

It is understood that the optical device of FIG. 2A may be used to amplify, modulate or detect light transmitted through the optical waveguide of the device by applying an electrical difference to complimentary electrodes 206 and 212 to either forward bias (i.e., for amplification) or reverse bias (i.e., for modulation or detection) the structure. The complex refractive index (i.e., at least one of the real and the imaginary refractive index) of at least the portion of active layer 209 included in optical mode 213 changes based on an electrical difference (e.g., electrical voltage, electrical field) applied to electrodes 206 and 212. These changes to the refractive index (or indexes) are proportional to the strength of the electrical difference applied to electrodes 206 and 212.

In this example, electrodes 212 are coupled to n-type layer 210. Thus, it is to be understood that there is no electrical conduction through silicon top layer 201. As opposed to variations where electrical conduction does occur through the silicon top layer of a device, resistance is high as it determined by thin layer 210; however, there are less processing steps needed to create device 200 and no conductive bond is required to couple the silicon region with the III-V region (i.e., no conductive bond is required to couple layers 210 and 201).

Other examples of silicon photonic devices are manufactured by Intel Corporation of Santa Clara, Calif., Skorpis Technology, Inc. 5600 Eubank Blvd. NE Suite 200, Albuquerque, N. Mex. 87111, Luxtera, Inc. of 2320 Camino Vida Roble, Carlsbad, Calif. 92011, Mellanox Technologies, Inc. 350 Oakmead Parkway, Suite 100 Sunnyvale, Calif. 94085, and am Lightwire, Inc. Headquartered in Allentown, Pa. (now Cisco Systems, Inc., Corporate Headquarters, 170 West Tasman Dr., San Jose, Calif. 95134) among others.

Figure 3:
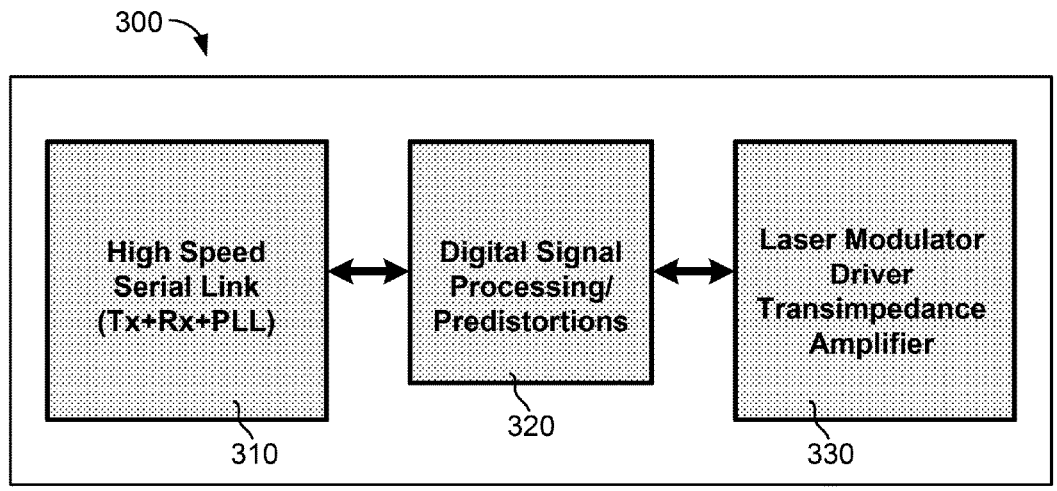
FIG. 3 is a simplified diagram of an electrical silicon die block according to an embodiment of the present invention.

FIG. 3 is a simplified diagram of an electrical silicon die block according to an embodiment of the present invention. This diagram is merely an example, which should not unduly limit the scope of the claims. One of ordinary skill in the art would recognize many variations, alternatives, and modifications. In an embodiment, the electrical silicon die block 300 is an electrical signal processing block that connects a low speed electrical interface to a high speed optical interface. There are several elements to this block diagram. As shown, the electrical silicon die block 300 includes a high speed serial link 310, a digital signal processing/pre-distortion unit 320, and a laser modulator driver and TIA unit 330. The high speed serial link 310 includes an input/output block having an RX (receiving) functional unit and a TX (transmitting) function unit coupled to a phase lock loop circuit. For example, the TX function unit drives the loopback signals that are processed by the RX functional unit. Using the high speed serial link 310, the data first is able to be converted from the many parallel streams of lower speed data into a high speed serial stream (there may be more than one such high speed stream depending on the total data rate). The digital signal processing/pre-distortion unit 320 is configured to process or convert digital electrical signal back and forth to optical signal and conduct all signal modulation, error encoding/decoding, and signal distortion compensation. The high speed streams converted by the high speed serial link 310 are then encoded and digitally compensated to account for distortions in the transmit and receive paths. The final interface to the optical components is achieved via the modulator driver (transmit path) and the transimpedance amplifier (receive path). The laser modulator driver and TIA unit 330 is configured to control the optical device (such as the optics silicon photonics die on the part of the multi-chip module in FIG. 2). In a specific embodiment, the electrical silicon die block 300 is a single hybrid die as part of the multi-chip module shown in FIG. 2.

Figure 4:
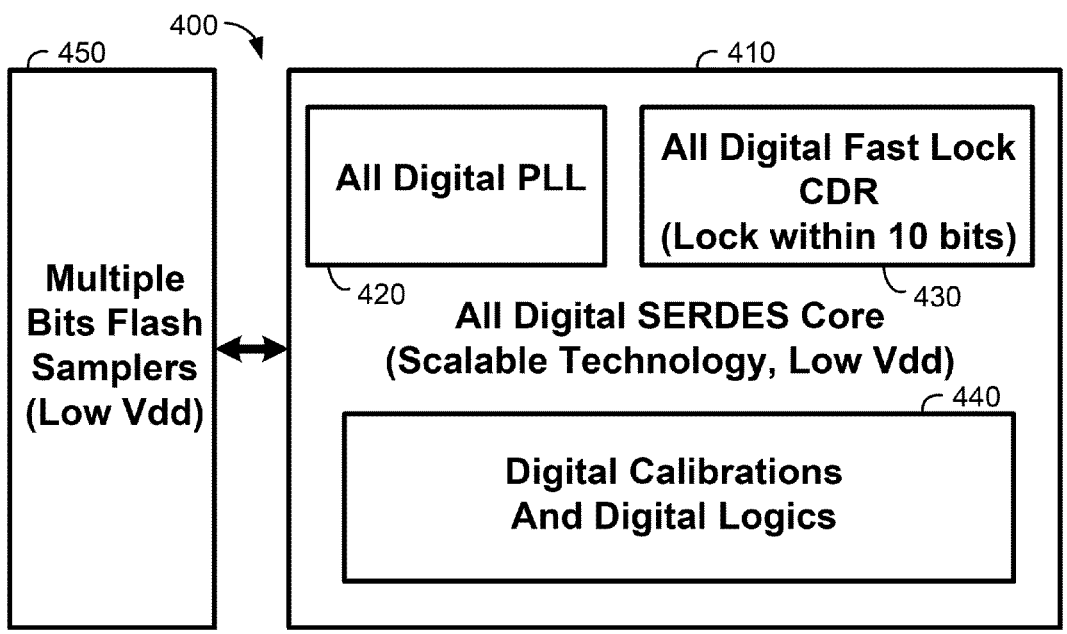
FIG. 4 is a simplified diagram of high speed serial link block according to an embodiment of the present invention.

FIG. 4 is a simplified diagram of high speed serial link block according to an embodiment of the present invention. This diagram is merely an example, which should not unduly limit the scope of the claims. One of ordinary skill in the art would recognize many variations, alternatives, and modifications. As shown, the present device 400 is a high speed serial link block which provides details of the signal interface between the high speed optical and the lower speed electrical sides. In an embodiment, the high speed serial link block comprises multiple Bits Flash Samplers 450 and an all-digital SerDes core unit 410 powered under a low Vdd power supply. The samplers 450 are part of RX functional unit of the input/output block 310. The all-digital SerDes core unit 410 comprises an all digital phase lock loop (PLL) block 420, a fast lock CDR block 430, and Digital offset calibrations and logics block 440, also belonging to the RX functional unit (310 of FIG. 3). In another embodiment, the high speed serial link block is an electrical input/output block provided on either a single chip or a silicon die of package substrate member and coupled to the data input/output interface. Some of the essential components of the electrical input/output block are CDR (clock and data recovery circuits), PLL (phase lock loops), and SerDes (Serializers and Deserializers). In an example, the input/output block comprises a SerDes block, a CDR block, a compensation block, and an equalizer block, among others. The output of equalizer includes receiver input. These circuits in combination convert multiple streams of input data (electrical side) to fewer streams of output data (optical side). These circuits also need to be calibrated and controlled to operate correctly. In a specific embodiment, the serial link block 310 of FIG. 3 can be configured like block 400.

Figure 5:
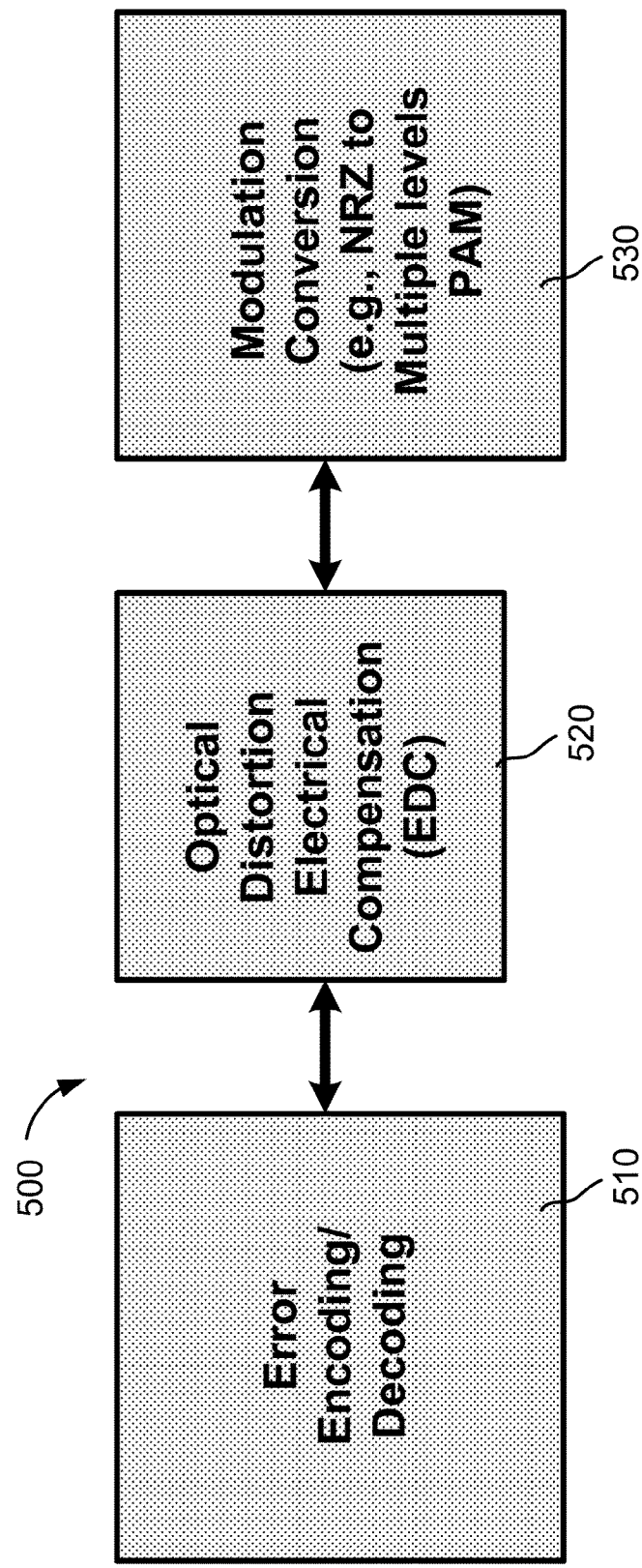
FIG. 5 is a simplified diagram of a digital processing/signal pre-distortion block according to an embodiment of the present invention.

FIG. 5 is a simplified diagram of a digital processing/signal pre-distortion block according to an embodiment of the present invention. This diagram is merely an example, which should not unduly limit the scope of the claims. One of ordinary skill in the art would recognize many variations, alternatives, and modifications. As shown, the digital processing/signal pre-distortion block 500 comprises at least an Error Encoding/Decoding block 510, an Optical Distortion/Electrical Compensation (EDC) block 520, and a Modulation Conversion block 530. In an example, it shows the details of a possible implementation of the electronic processing blocks in the transmit and receive paths. In an alternative embodiment, some of those blocks may be configured differently in the transmit versus the receive path. One of the essential blocks is the Error Encoding/Decoding block 510 which performs data error control coding. As additional data bits are added to blocks of signal data in such a way that when errors occur they may be correctable in the receive path. Modern error control codes are sophisticated that they can correct, e.g., up to 1 error in every 100 bits with modest data overhead and latency. Optical distortion compensation block 520 helps compensate for impairments in the optical and electrical transmission paths. These could include compensation of, e.g., bandwidth limitations and inter-symbol interference. The modulation conversion block 530 codes and decodes the multi-level higher-order modulation signals that are used at the transmitter and receiver, and converts them to the simple two-level NRZ format used in the lower speed interfaces.

Figure 6:
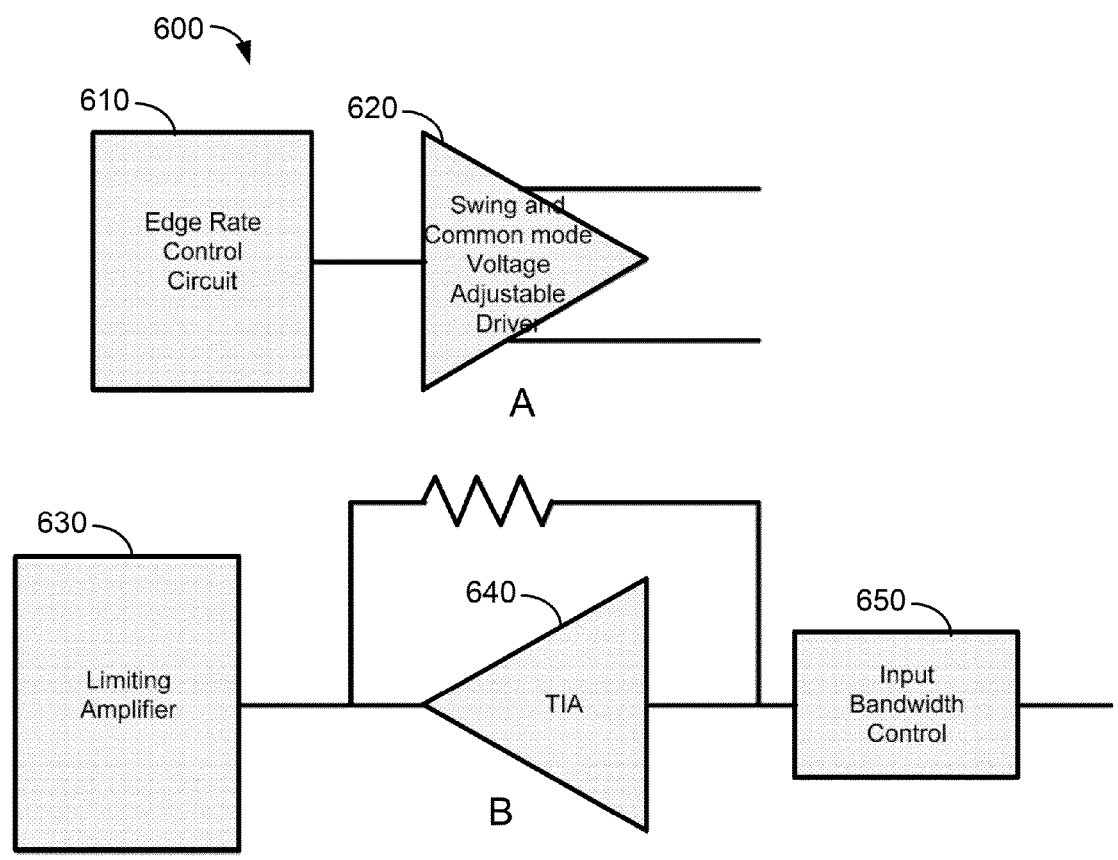
FIG. 6 is a simplified diagram of an electrical laser driver and TIA block diagram according to an embodiment of the present invention.

FIG. 6 is a simplified diagram of an electrical laser driver and TIA block diagram according to an embodiment of the present invention. This diagram is merely an example, which should not unduly limit the scope of the claims. One of ordinary skill in the art would recognize many variations, alternatives, and modifications. As shown, the top part circuit (A) of an electrical laser driver and TIA block 600 includes an edge rate control circuit 610 coupled to a swing and common mode voltage adjustable driver 620. In an implementation, the driver 620 will be used for the modulator and the receiver circuit for a photo diode detector (to be shown in FIG. 7 below). The electrical output of the top circuit (A) is used to drive the modulator. The modulator imprints the electrical signal input on to the optical carrier. The driver and TIA block 600 can also include a limiting amplifier 630 coupled to a TIA 640, which can be coupled to an input bandwidth control block 650. The output of the photo diode detector is the input to the bottom part circuit (B) of the electrical laser driver and TIA block 600. This circuit converts the current signal from the photo diode detector into a voltage signal which can then be processed by other circuits. In an example, the electrical laser driver and TIA block 600 is block 330 included in the electrical silicon die block shown in FIG. 3.

Figure 7:
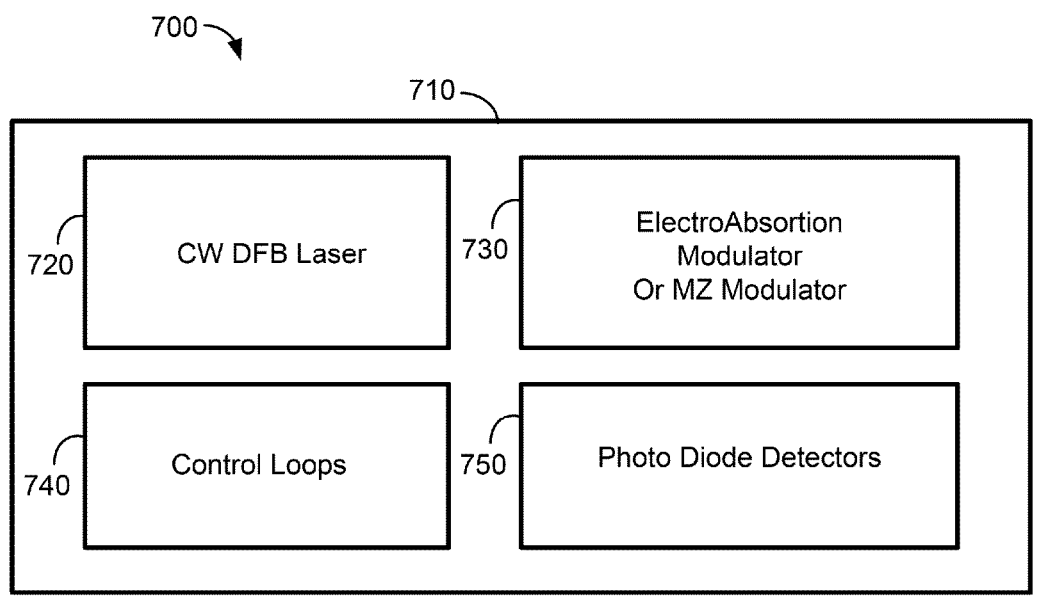
FIG. 7 is a simplified diagram of a silicon photonic block diagram according to an embodiment of the present invention.

FIG. 7 is a simplified diagram of a silicon photonic block diagram according to an embodiment of the present invention. This diagram is merely an example, which should not unduly limit the scope of the claims. One of ordinary skill in the art would recognize many variations, alternatives, and modifications. As shown, in an embodiment, a silicon photonic block 700 includes a substrate 710, a continuous wave (CW) distributed feedback (DFB) laser block 720, an electro-absorption modulator or MZ modulator 730, control loops 740, and photo diode detectors 750. In a specific embodiment, the silicon photonic block 700 includes common blocks of an optical sub-system including control loops. The transmit path of the optical sub-system includes a laser source 720 which can be selected from a CW (continuous wave) DFB (distributed feedback) laser among others. The laser source 720 provides the optical carrier. The output from the laser source 720 is optically coupled into the laser modulator 730. The electrical data is converted to optical via the modulator for modulating the optical signal directly from the laser source 720. The modulator 730 may be an electro-absorption modulator or a Mach-Zehnder (MZ) modulator, or others depending on embodiments. The output signal from the modulator 720 is then coupled to a fiber (not shown) for external transmission. The receive path of the optical sub-system includes the optical signal from the fiber coupled into one or more photo diode detectors 750. The photo diode detector 750 converts the optical data into electrical data. The control loops 740 are needed to correctly bias the laser source 720, the modulator 730, and the one or more photo diode detectors 750. The bias control signals may include current or voltage outputs used to setup the laser source, modulator, and the photo diode detector correctly. The control output signals may also be continually adjusted using the feedback from the devices themselves.

Figure 8:
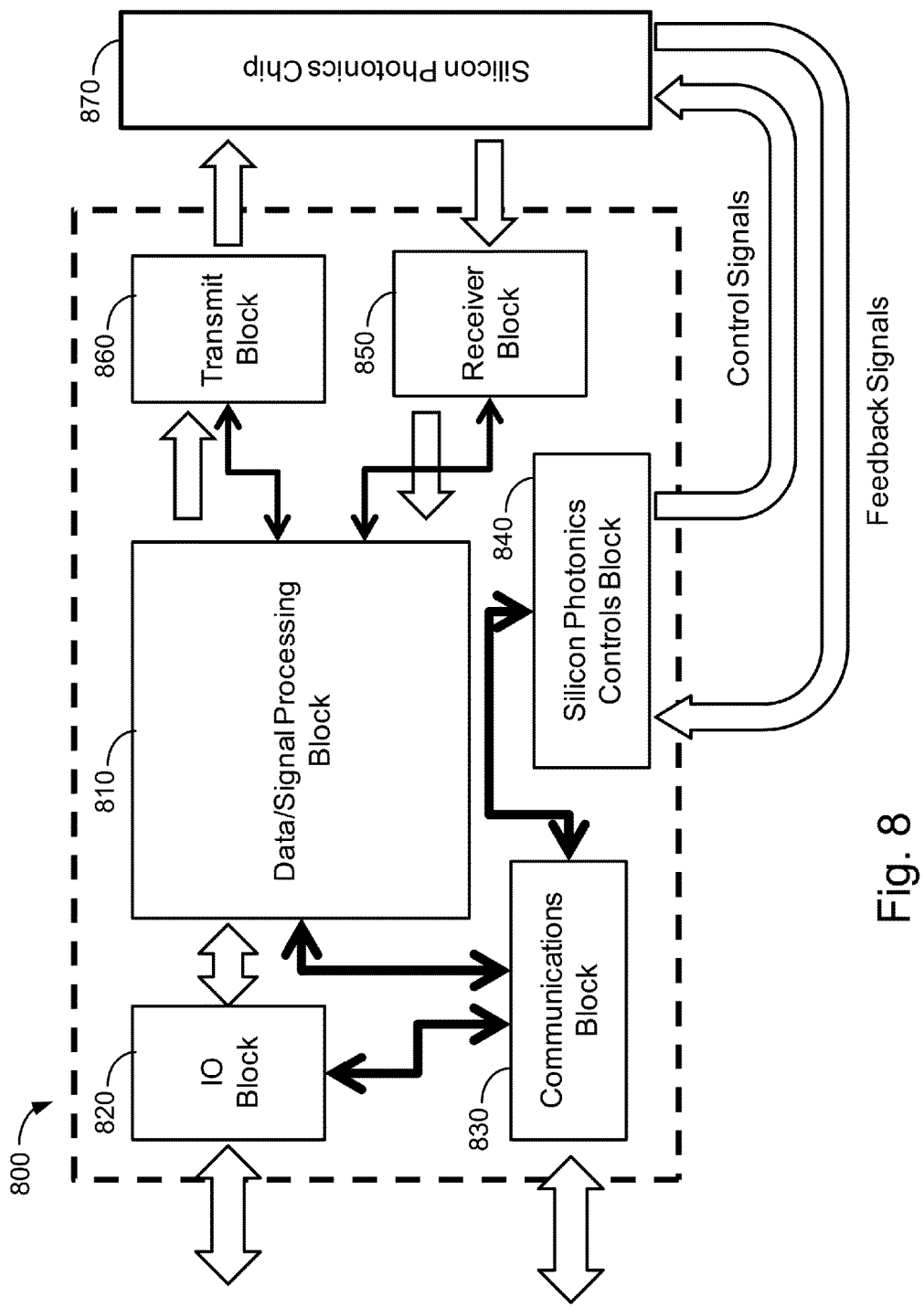
FIG. 8 is a simplified block diagram of a multi-chip module according to an alternative embodiment of the present invention.

FIG. 8 is a simplified block diagram of a multi-chip module according to an alternative embodiment of the present invention. As shown, the present invention includes an integrated system on chip device. The device 800 is configured on a single silicon substrate member. The device 800 has a data input/output interface provided on the substrate member and configured for a predefined data rate and protocol. The device 800 has an input/output block 820 provided on the substrate member and coupled to the data input/output interface. In an example, the input/output block 820 comprises a SerDes block, a CDR block, a compensation block, and an equalizer block, among others. The device 800 has a signal processing block 810 provided on the substrate member and coupled to the input/output block 820. In an example, the signal processing block 810 is configured to the input/output block 820 using a bi-direction bus in an intermediary protocol. The device 800 has a driver module 860 provided on the substrate member and coupled to the signal processing block 810. In an example, the driver module 860 is coupled to the signal processing block 810 using a uni-directional multi-lane bus. In an example, the device 800 has a driver interface provided on the substrate member and coupled to the driver module 860 and configured to be coupled to a silicon photonics device 870. In an example, the driver interface is configured to transmit output data in either an amplitude modulation format or a combination of phase/amplitude modulation format or a phase modulation format. In an example, the device 800 has a receiver module 850 comprising a TIA block provided on the substrate member and to be coupled to the silicon photonics device 870 using predefined modulation format, and configured to the signal processing block 810 to communicate information to the input/output block 820 for transmission through the data input/output interface. In an example, the device 800 has a communication block 830 provided on the substrate member and operably coupled to the input/output block 820, the signal processing block 810, the driver block 860, and the receiver block 850, among others. The device 800 has a communication interface coupled to the communication block 830. The device 800 has a control block 840 provided on the substrate member and coupled to the communication block.

In an example, the signal processing block 810 comprises a FEC block, a digital signal processing block, a framing block, a protocol block, and a redundancy block, among others. The driver module is selected from a current drive or a voltage driver in an example. In an example, the driver module 860 is a differential driver or the like. In an example, the silicon photonics device 870 is selected from an electro absorption modulator (EAM) or electro optic modulator (EOM), or a Mach-Zehnder (MZ). In an example, the amplified modulation format is selected from NRZ format or PAM format. In an example, the phase modulation format is selected from BPSK or nPSK. In an example, the phase/amplitude modulation is QAM. In an example, the silicon photonic device 870 is configured to convert the output data into an output transport data in a WDM signal. In an example, the control block 840 is configured to initiate a laser bias or a modulator bias. In an example, the control block 840 is configured for laser bias and power control of the silicon photonics device 870. In an example, the control block 840 is configured with a thermal tuning or carrier tuning device each of which is configured on the silicon photonics device 870. In an example, the SerDes block is configured to convert a first data stream of N into a second data stream of M.

Figure 9:
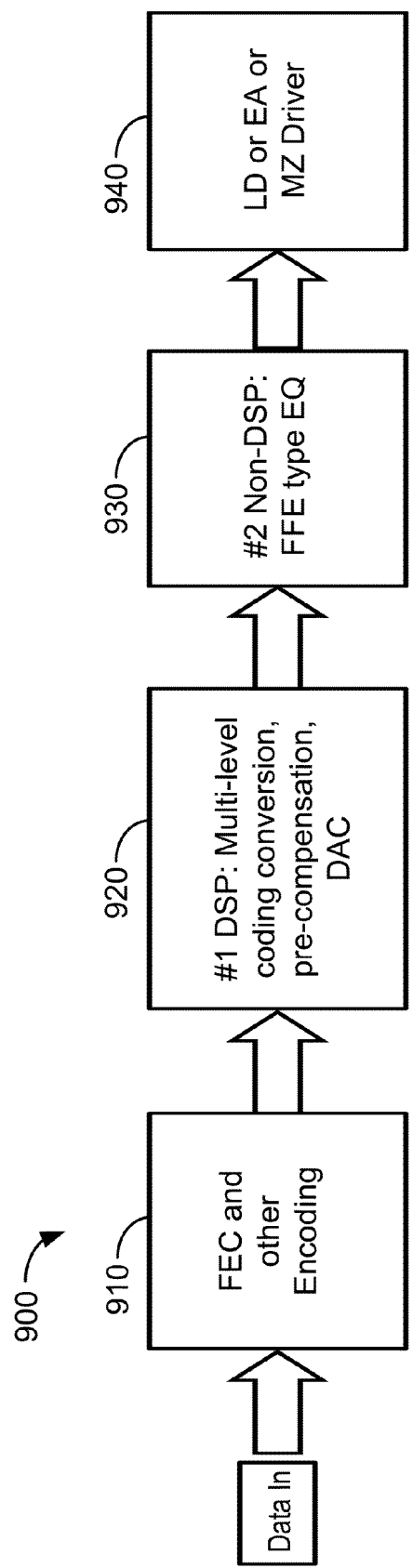
FIG. 9 is a simplified block diagram of data flow according to an embodiment of the present invention.

FIG. 9 is a simplified block diagram of data flow according to an embodiment of the present invention. As show is a stream of incoming data, which processed through multiple blocks. The blocks 900 include, among others, forward error correction 910, and other encoding 920, multi-level coding, pre-compression, and digital to analog coding. The blocks 900 also include non-DSP forward error correction 930, and a block corresponding to a laser diode or driver 940, among others. In an example, in the absence of a FEC from a host process, techniques include use of CDR2 type FEC, which is internal to the CMOS chip. In an example, FEC can be striped across each or all of data lanes. Of course, there can be variations, modifications, and alternatives.

Figure 10:
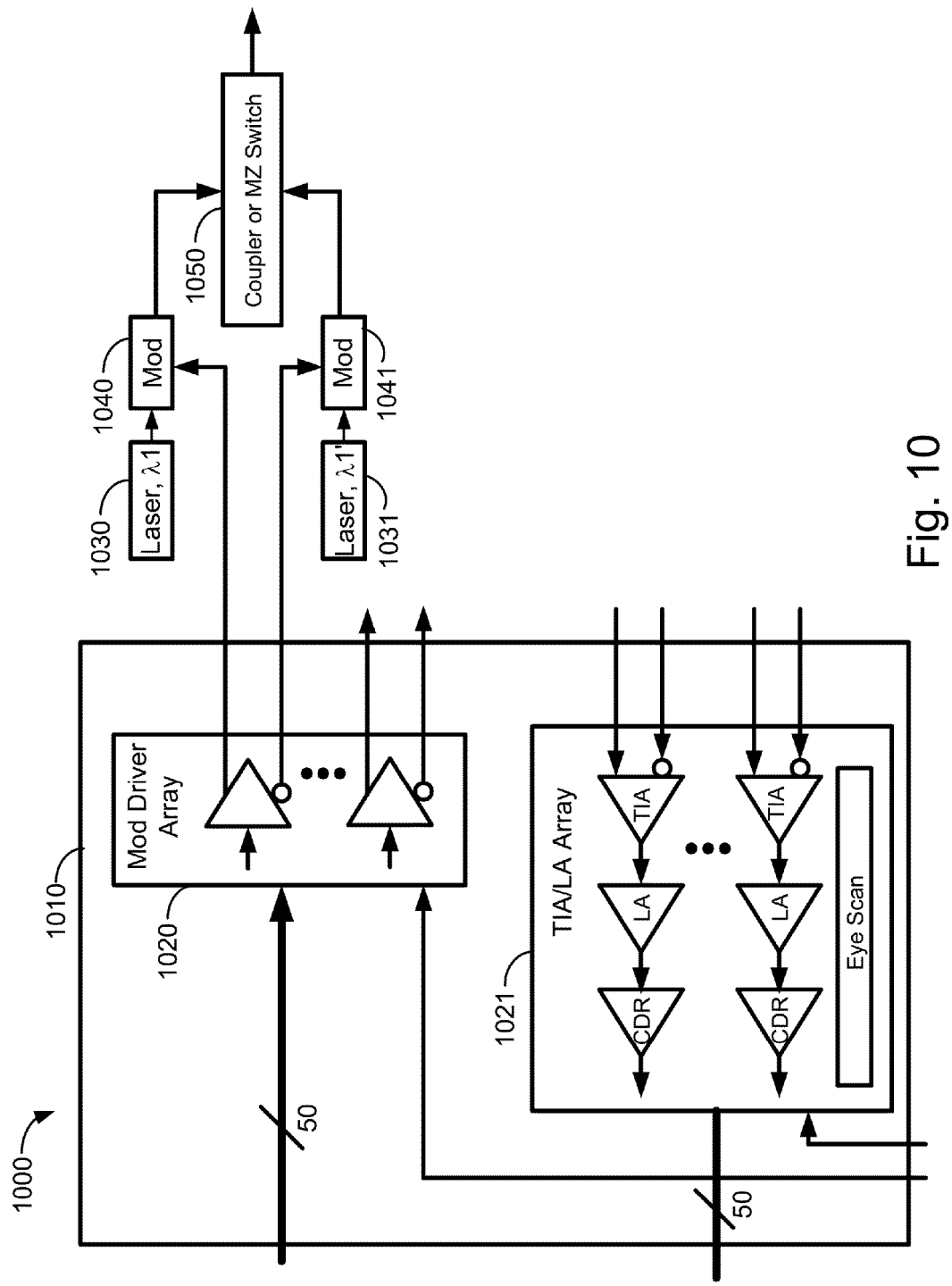
FIG. 10 is a simplified diagram illustrating a redundant laser configuration at a drive stage according to an embodiment of the present invention.

FIG. 10 is a simplified diagram illustrating a redundant laser configuration 1000 at a drive stage according to an embodiment of the present invention. In an example, the invention provides an integrated system-on-chip device 1010 as a fully redundant system having a redundant laser or lasers configured for each channel. The device 1010 can have a mod driver array 1020 and a TIA/LA array 1021. In an example, the device 1010 has a plurality of laser devices configured on the silicon photonics device. At least a pair of laser devices 1030, 1031 is associated with a channel and coupled to a switch 1050 to select one of the pair of laser devices to be coupled to an optical multiplexer to provide for redundant laser devices 1040, 1041. The worst case is to have 2 times total number of wavelengths with twice in chip size. In an embodiment, the switch is a Mach-Zehnder Interferometer (MZI) switch used to switch between a λ1 and a redundant λ1'. Or it could be a passive coupler. In another embodiment, it preserves the size of the wavelength multiplexer so that no additional λ channels are needed. Note, the integrated system-on-chip device doesn't have to operate the redundant λ1' until needed, therefore no power consumption penalty is applied.

Figure 11:
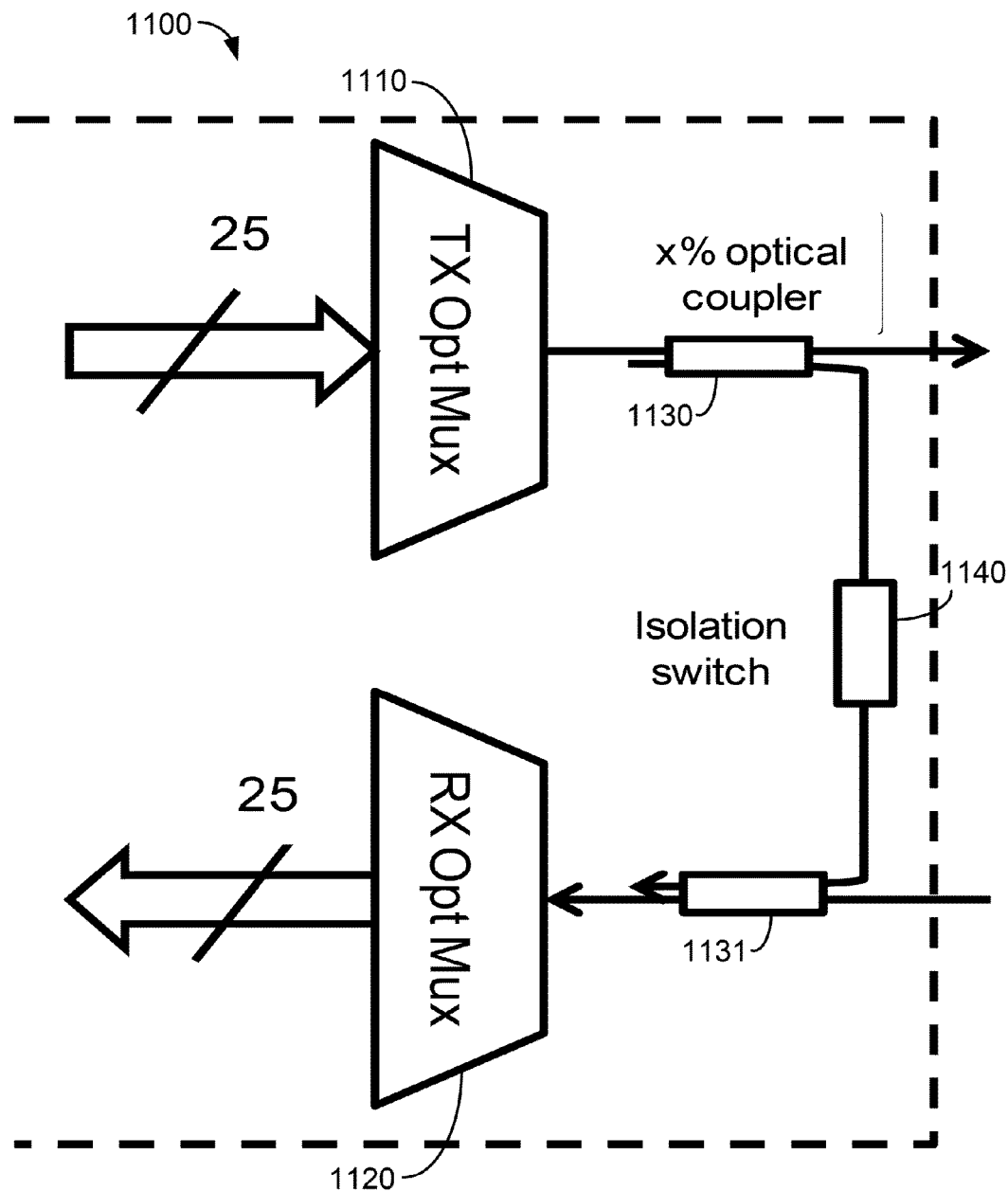
FIG. 11 is a simplified diagram illustrating a built-in self test using an optical loop back according to an embodiment of the present invention.

FIG. 11 is a simplified diagram illustrating a built-in self test 1100 using an optical loop back according to an embodiment of the present invention. As shown are a TX multiplexer 1110 and an RX multiplexer 1120 for a silicon photonics device. In an example, the present invention provides an integrated system on chip device having a self test using a loop back technique. In an example, the device has a self-test block provided on the substrate. In an example, the self test block is configured to receive a loop back signal from at least one of the digital signal processing block, the driver module, or the silicon photonics device. In an example, the self test block comprises a variable output power switch configured to provide a stress receiver test from the loop back signal. Also shown is an isolation switch 1140 between RX and TX. Optical couplers 1130 and 1131 are coupled to the multiplexer 1110 and an RX multiplexer 1120, respectively, as well as the isolation switch 1140.

In an example, the present technique allows a loop back test capability on the device, which is now a silicon photonic application specific integrated circuit or a communication system on chip device, as described. In an example, the technique is provided for diagnostic and setup during power up sequence. In an example, an optical tap coupler on the output side connected to the input side as shown. In an example as shown, x (e.g., <10%) is selected to reduce and/or minimize an impact an output power as well an impact at the input power given that input power is generally much lower than the output power. In an example, to prevent crosstalk in the present loop back path, an isolation switch has been configured as shown. In an example, without the isolation switch there is undesirably direct crosstalk between the output and input as shown. In an example, about 30 dB isolation is included to prevent coherent crosstalk. Of course, there can be variations.

Figure 12:
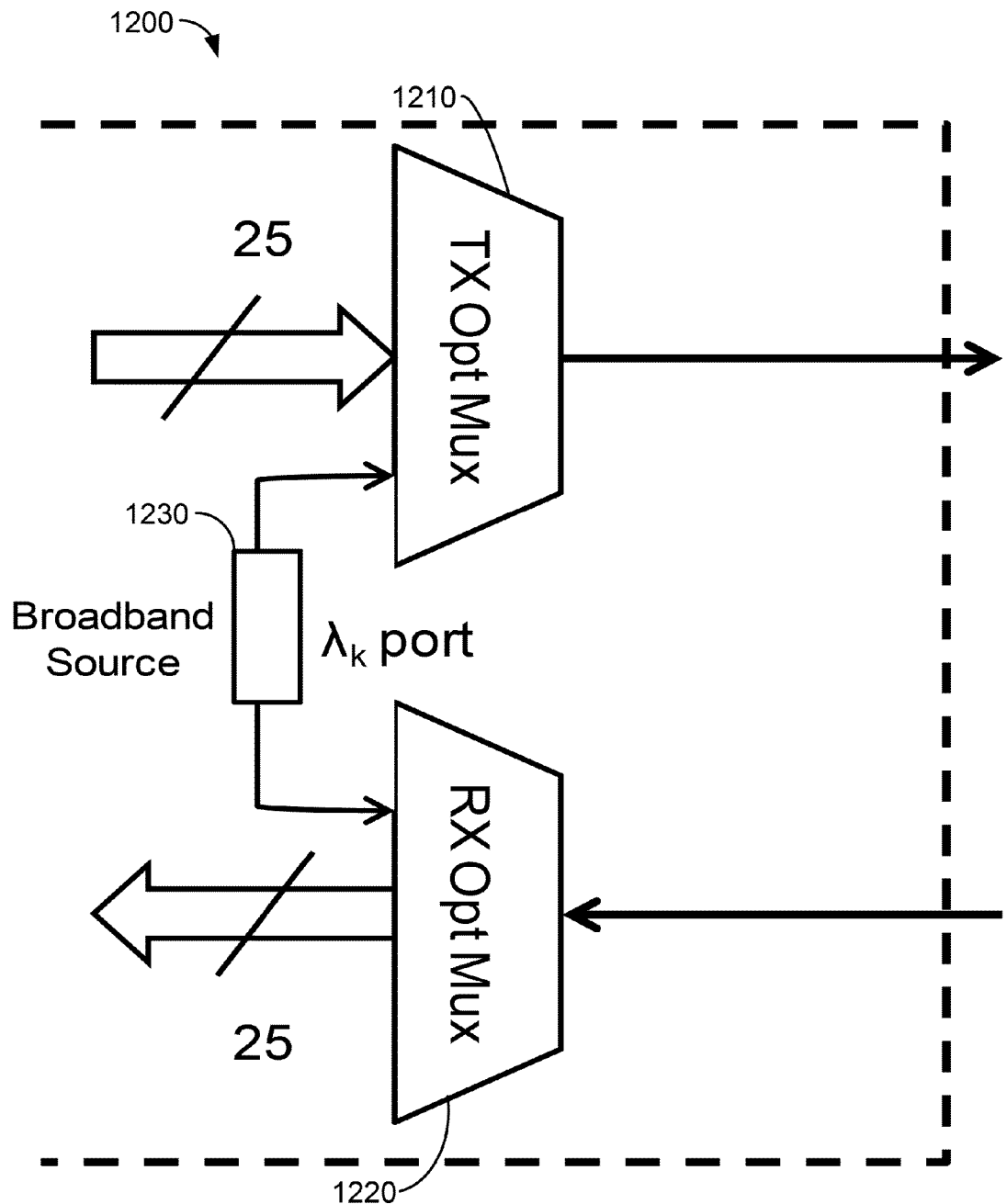
FIG. 12 is a simplified diagram illustrating a built-in self test configured for optical testing according to an embodiment of the present invention.

FIG. 12 is a simplified diagram illustrating a built-in self test 1200 configured for optical testing according to an embodiment of the present invention. In an example, the present invention provides an integrated system on chip device having a built-in self test technique. As shown are a TX multiplexer 1210 and an RX multiplexer 1220 for a silicon photonics device. A broad band source 1230 is coupled to each of the multiplexers. Multiple sources can also be included. In an example, the device has a self test block configured on the silicon photonics device and to be operable during a test operation. In an example, the self test block comprises a broad band source configured to emit electromagnetic radiation from 1200 nm to 1400 nm or 1500 to 1600 nm to a multiplexer device. In an example, the broad band source 1230 can be an LED or other suitable device. The device also includes a self test output configured to a spectrum analyzer device external to the silicon photonics device. In an example, the technique can be provided during a calibration process. That is, if after calibration, a center λ of each multiplexer changed, the present technique including built-in light source will quantify or indicate the change in an example. In an example, the broadband source 1230 in silicon photonics is a light source with no optical feedback, although there can be variations.

Figure 13:
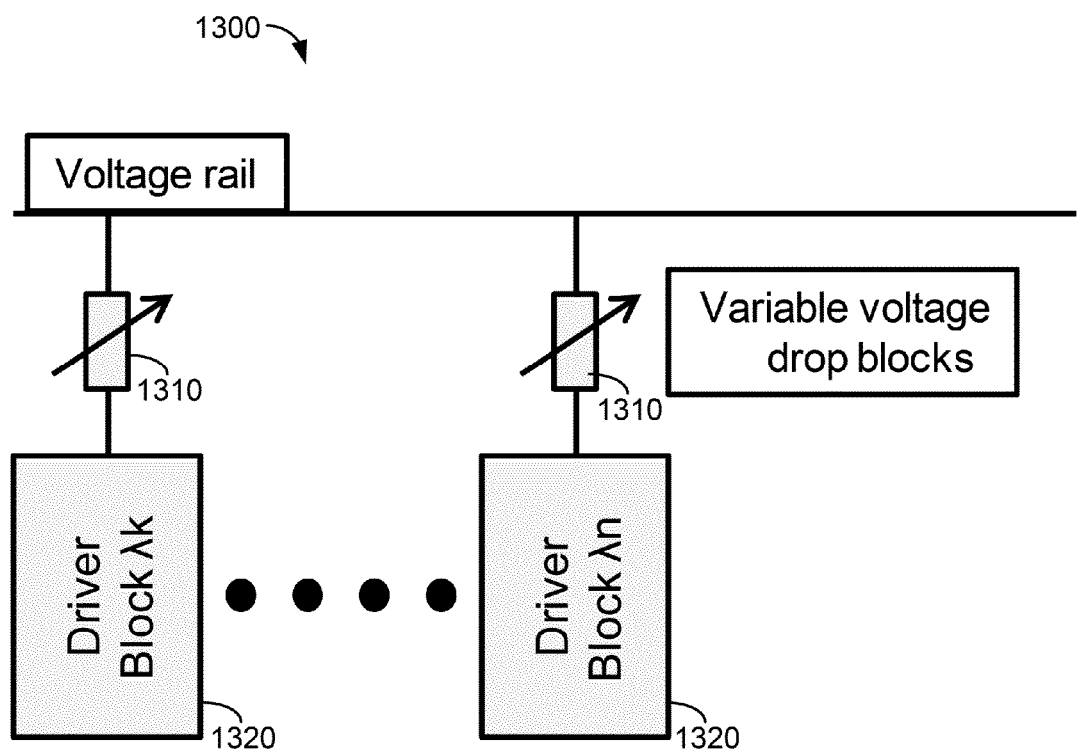
FIG. 13 is a simplified diagram illustrating a variable bias for optical elements configured within a silicon photonic device according to an embodiment of the present invention.

FIG. 13 is a simplified diagram illustrating a variable bias for optical elements configured in a silicon photonic device according to an embodiment of the present invention. As shown schematic configuration of using variable bias for modulation transfer provided for optical elements. In an example, the device has an integrated system on chip device having a capability selectively adjust each optical modulator to accommodate for fabrication tolerances, wavelength operation, and/or extinction ratio, among other parameters. The device has a single silicon substrate member and a data input/output interface provided on the substrate member and configured for a predefined data rate and protocol. In an example, the device has an input/output block provided on the substrate member and coupled to the data input/output interface. In an example, the input/output block comprises a SerDes block, a CDR block, a compensation block, and an equalizer block, among others. The device has a signal processing block provided on the substrate member and coupled to the input/output block. The signal processing block is configured to the input/output block using a bi-direction bus in an intermediary protocol. The device has a driver module provided on the substrate member and coupled to the signal processing block.

In an example, the driver module is coupled to the signal processing block using a uni-directional multi-lane bus. In an example, the device has a driver interface provided on the substrate member and coupled to the driver module and configured to be coupled to a silicon photonics device. In an example, the driver interface is configured to transmit output data in either an amplitude modulation format or a combination of phase/amplitude modulation format or a phase modulation format. In an example, the device has a receiver module comprising a TIA block provided on the substrate member and to be coupled to the silicon photonics device using predefined modulation format, and configured to the signal processing block to communicate information to the input/output block for transmission through the data input/output interface. In an example, the device has a communication block provided on the substrate member and operably coupled to the input/output block, the signal processing block, the driver block, and the receiver block, and among others. The device has a communication interface coupled to the communication block and a control block provided on the substrate member and coupled to the communication block.

In an example, the device has a variable bias block 1300 configured with the control block. In an example, the variable bias block is configured to selectively tune each of a plurality of laser devices provided on the silicon photonics device to adjust for at least a wavelength of operation, a fabrication tolerance, and an extinction ratio. As shown is a plurality of driver blocks 1320. Each of the driver blocks 1320 is coupled to a voltage rail, and is configured with a variable voltage device 1310 to selectively tune each of the laser devices. In an example, each of the laser devices can be configured with an optical modulator(s) such as electro-absorption modulators, electro-optical modulators, among others, which often couple to a direct current power or bias. In an example, the DC bias is a function of wavelength of operation and also of fabrication tolerances, among other factors. In an example, the present bias circuitry accommodates and/or corrects for any bias variations, while desirably controlling power. Of course, there can be variations, modifications, and alternatives.

Figure 14:
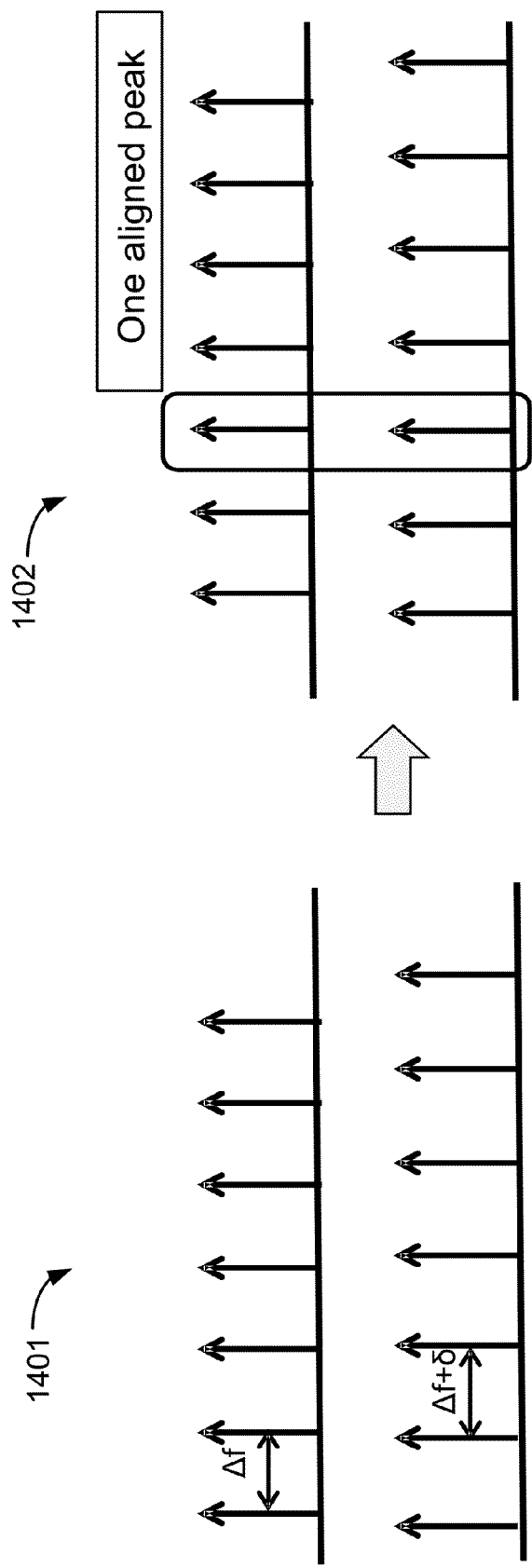
FIG. 14 is a simplified diagram illustrating wavelength tuning configured to silicon photonic device according to an embodiment of the present invention.

FIG. 14 is a simplified diagram illustrating wavelength tuning configured to silicon photonic device according to an embodiment of the present invention. In an example, the present tunable laser uses a set of rings with resonant frequencies that a slightly different. In an example, the technique use a vernier effect to tune the laser over a wide frequency range—limited by the bandwidth of the gain region. In an example, the vernier desirably would be held in lock with respect to one another. In an example, the technique uses a dither frequency on one of the biases (e.g., heater) and lock the ring to the maximum transmission of the second ring, although there can be variations. As shown in graph 1401, resonant combs are generally misaligned in an example. When thermally tuned, techniques can be used to selectively align one of the combs to another comb or spatial reference as shown in graph 1402. In an example, to maintain alignment, the technique dithers the signal to one of the rings. Of course, there can be variations, alternatives, and modifications.

Figure 15:
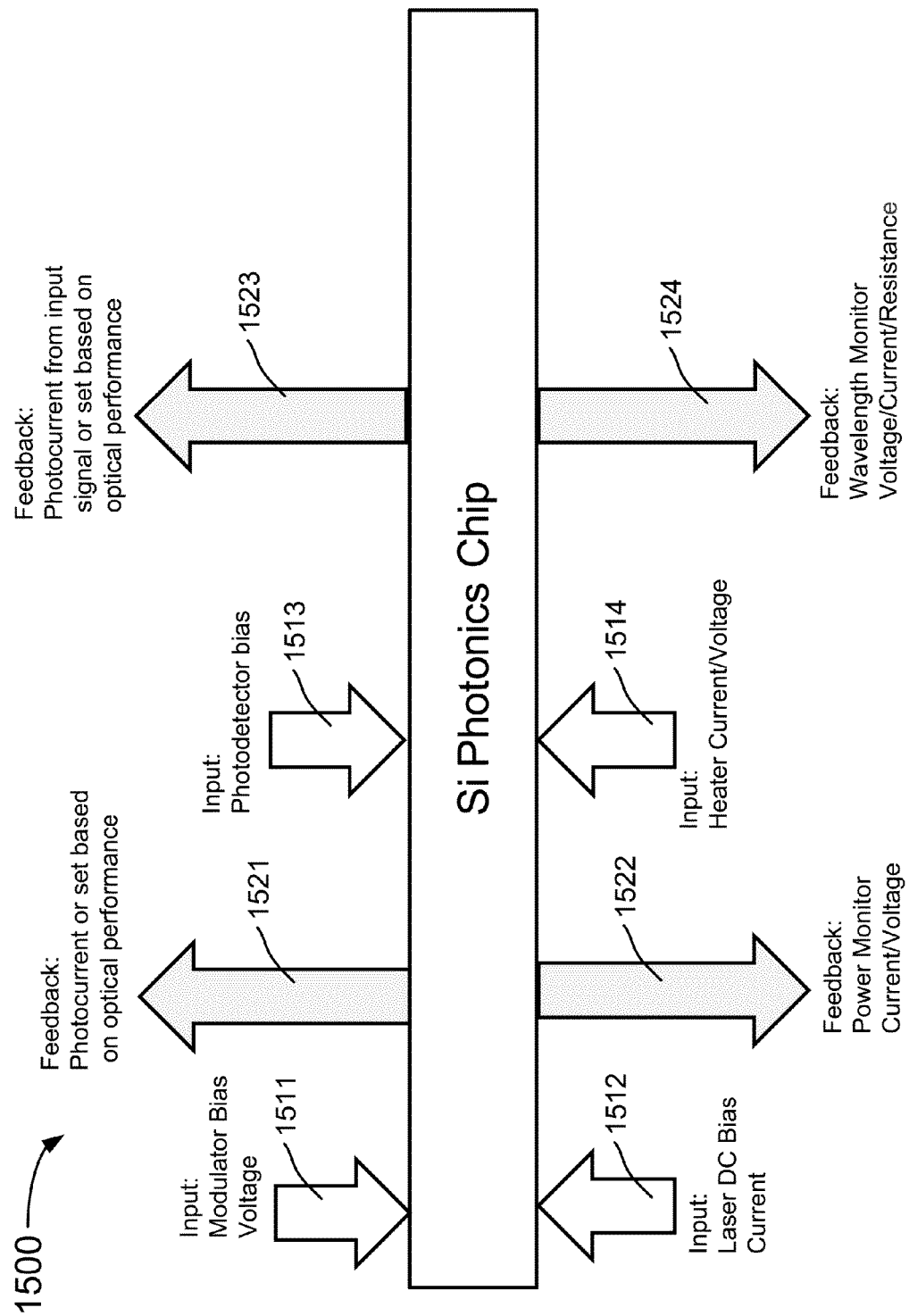
FIG. 15 is a simplified block diagram of an interface for a silicon photonics device according to an embodiment of the present invention.

FIG. 15 is a simplified block diagram of a control interface for a silicon photonics device according to an embodiment of the present invention. In an example, the control interface is provided to communicate between the control block and the silicon photonics device (see FIG. 8). The control interface 1500 includes one or more of a modulator bias voltage input 1511, a laser DC bias current input 1512, a photocurrent or set output 1521, a power monitor current/voltage output 1522, a photodetector bias input 1513, a heater current/voltage input 1514, a photocurrent from input signal or set output 1523, a wavelength monitor voltage/current/resistance output 1524, among other elements. The modulator bias input 1511 can be either RF or DC voltage for control both amplitude modulator and phase modulator to convert electrical data into WDM optical data within the silicon photonics device. The laser DC bias current input 1512 is used to control the gain or active region of the laser. The photodetector bias input 1513 is used to control a detector coupled with a tapped portion of the muxed light at output port of the silicon photonics device. The heater current/voltage input 1514 is using both current and voltage to control one or more thermoelectric tuner to determining a desired laser operation point including a locked wavelength per each channel and a desired power. All these input signals are control signals used by the control block (see FIG. 8). Of course, there can be variations.

The photocurrent or set output 1521 is a feedback from the silicon photonics device, which is used for the control block to adjust the one or more input signals mentioned above or set based on the optical performance. The power monitor current/voltage output 1522 is feedback for determining desired laser power. The photocurrent from input signal or set output 1523 and wavelength monitor voltage/current/resistance output 1524 are other feedback signals processed by the control interface 1500 for properly operating the silicon photonics device. All these output or feedback signals are employed in an optical loopback scheme. Of course, there can be other variations.

Figure 16:
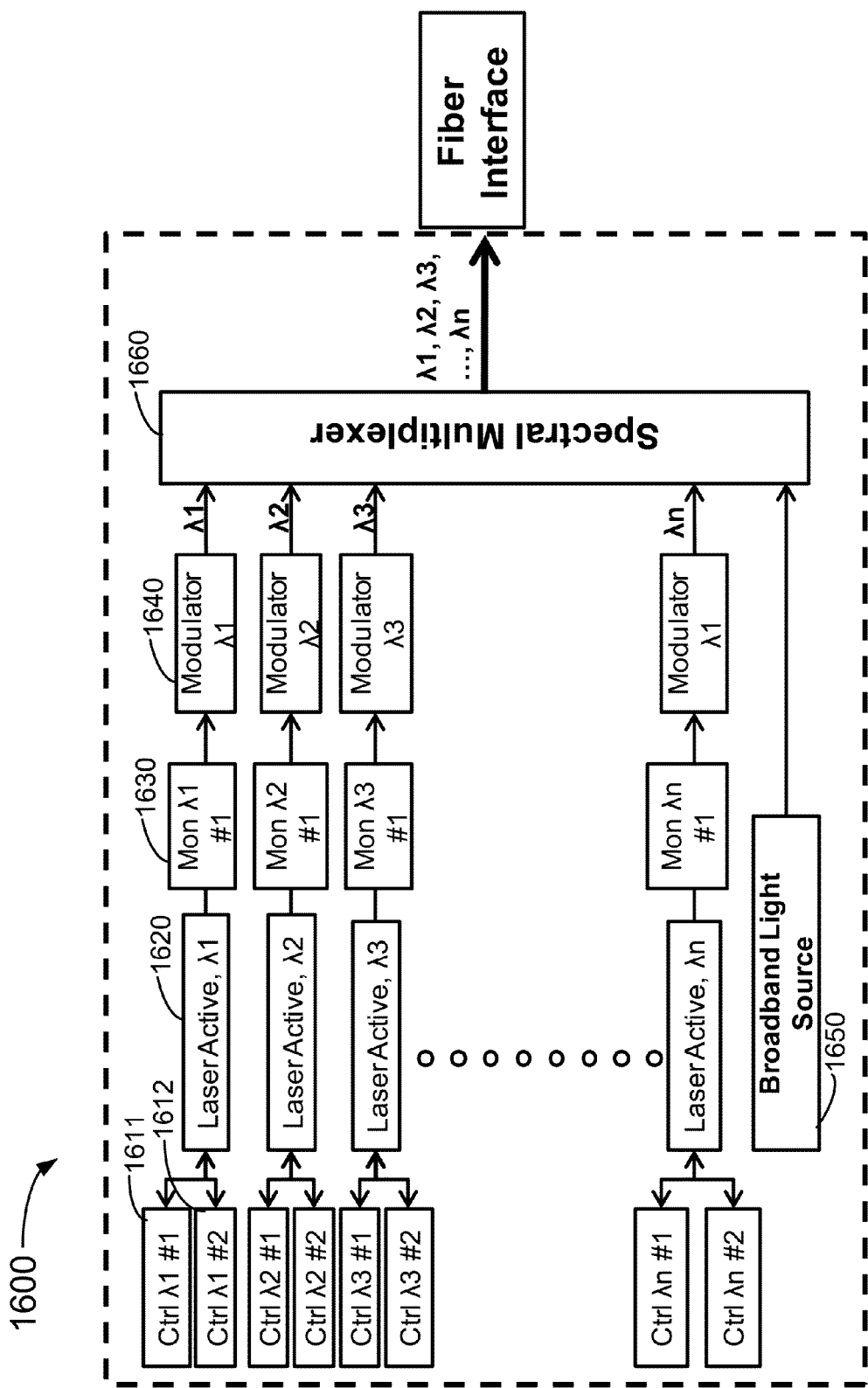
FIG. 16 is a simplified diagram illustrating a laser configuration at a transmitter side of a silicon photonics device according to an embodiment of the present invention.

FIG. 16 is a simplified diagram illustrating a laser configuration 1600 at a transmitter side of a silicon photonics device according to an embodiment of the present invention. The silicon photonics device is one associated with the system-on-chip device illustrated in FIG. 8. As shown are a plurality of laser devices 1620 arranged in different channels with different wavelengths numbered from wavelength $\lambda_1$ to $\lambda_n$, each of which has a modulator device 1640, and are collectively coupled to a spectral multiplexer 1660. Each of the laser devices 1620 are coupled to a pair of control blocks, such as blocks 1611 and 1612, and monitor blocks 1630. The spectral multiplexer 1660 is coupled to a fiber interface 1670. Each channel has two laser drivers for controlling optical signals either by DC current or DC and Dither frequency, before the laser active region, a wavelength controller and locker, a modulator device for tuning the laser based on the original electrical data bits, and are collectively coupled to a spectral multiplexer. The spectral multiplexer is coupled to a fiber interface for transmitting out a WDM signal representing the original data 1G, 4G, 10G, or 100G, among others with multi-rate format. As shown, alternatively, a broadband source is also included in parallel with the laser configuration at the transmitter side of the silicon photonics device, as previously noted.

Figure 17:
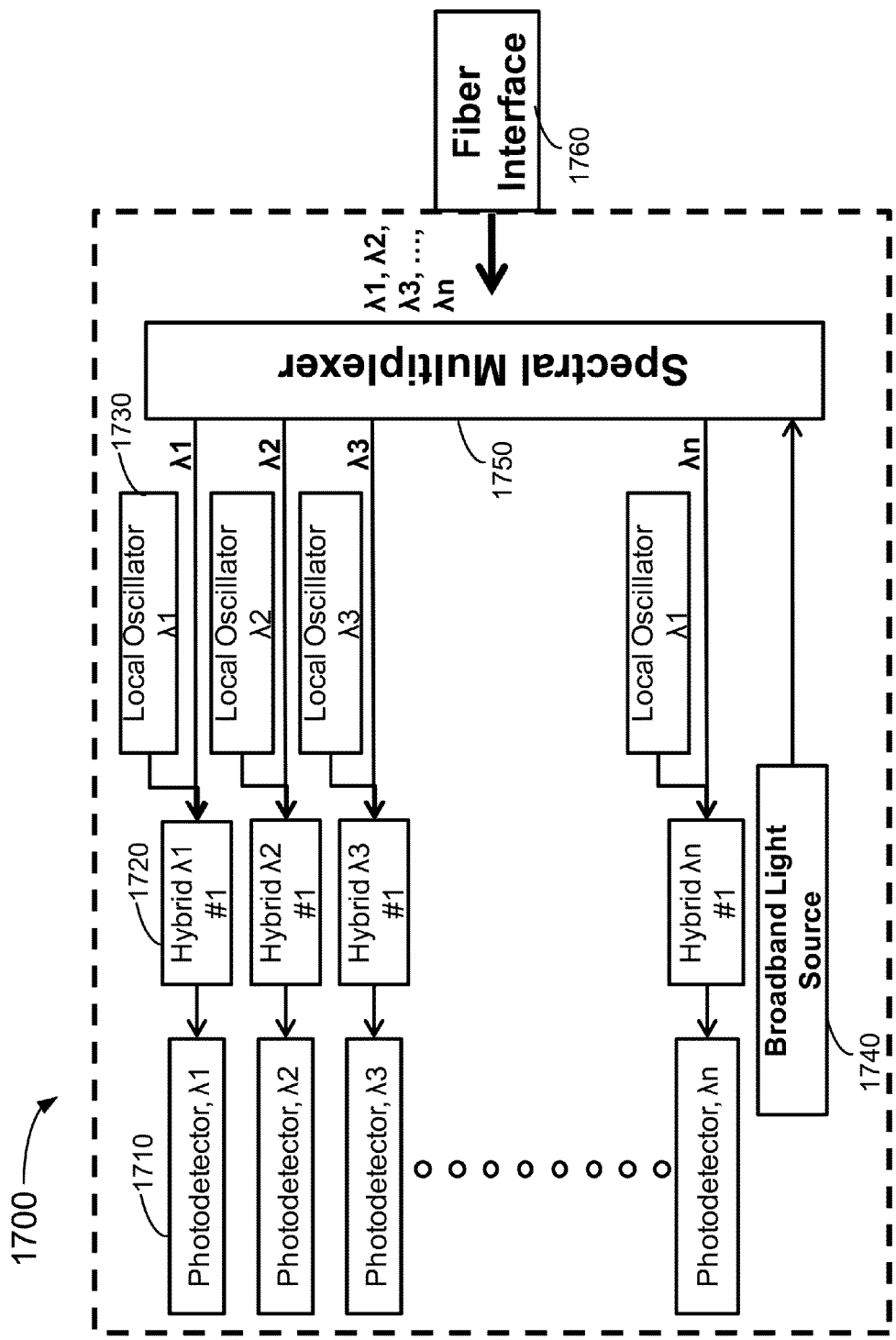
FIG. 17 is a simplified diagram illustrating a laser configuration at a receiver side of a silicon photonics device according to an embodiment of the present invention.

FIG. 17 is a simplified diagram illustrating a laser configuration 1700 at a receiver side of a silicon photonics device according to an embodiment of the present invention. The silicon photonics device is one associated with the system-on-chip device illustrated in FIG. 8. As shown are a plurality of detectors 1710 arranged for each channel with wavelength $\lambda_1$ to $\lambda_n$, each of which has a oscillator device 1730, and are collectively coupled to a spectral multiplexer 1750. Each of the photodetector blocks 1710 can be coupled to hybrid blocks 1720. The spectral multiplexer is coupled to a fiber interface 1760. The spectral multiplexer 1750 is coupled to a fiber interface to receive the incoming WDM signals. After each wavelength is demultiplexed, it is mixed in the hybrid block 1720 with a local oscillator signal from the oscillator device 1730 per each channel. The detector per channel is configured to convert the hybrid optical signals into photocurrent as electrical signals. As shown in FIG. 17, a broadband source 1740 is included in parallel, as previously noted.

Figure 18:
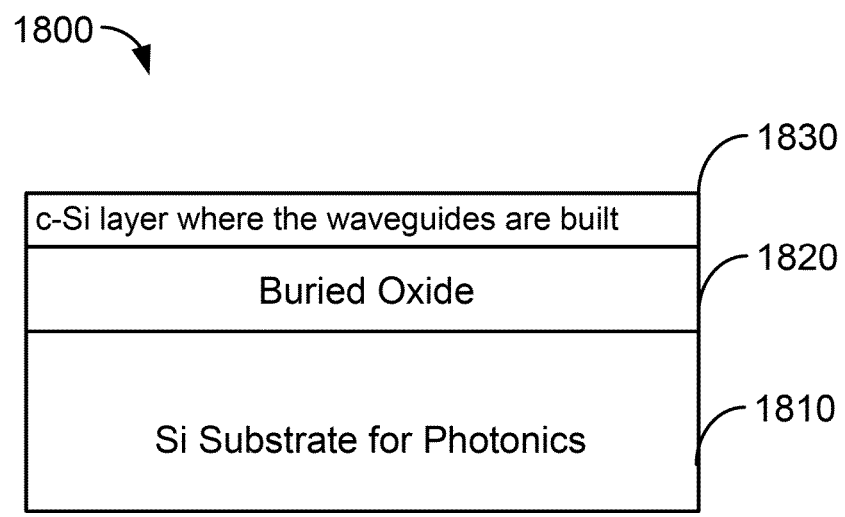
FIG. 18 is a simplified diagram illustrating a hybrid light source for a silicon photonics device according to an embodiment of the present invention.

FIG. 18 is a simplified diagram illustrating a hybrid light source 1800 for a silicon photonics device according to an embodiment of the present invention. As shown is a silicon substrate 1810 for photonics devices, and overlying buried oxide region 1820, and an overlying crystalline silicon material 1830 configured for a waveguide or guides. Of course, there can be other variations, modifications, and alternatives.

Figure 19:
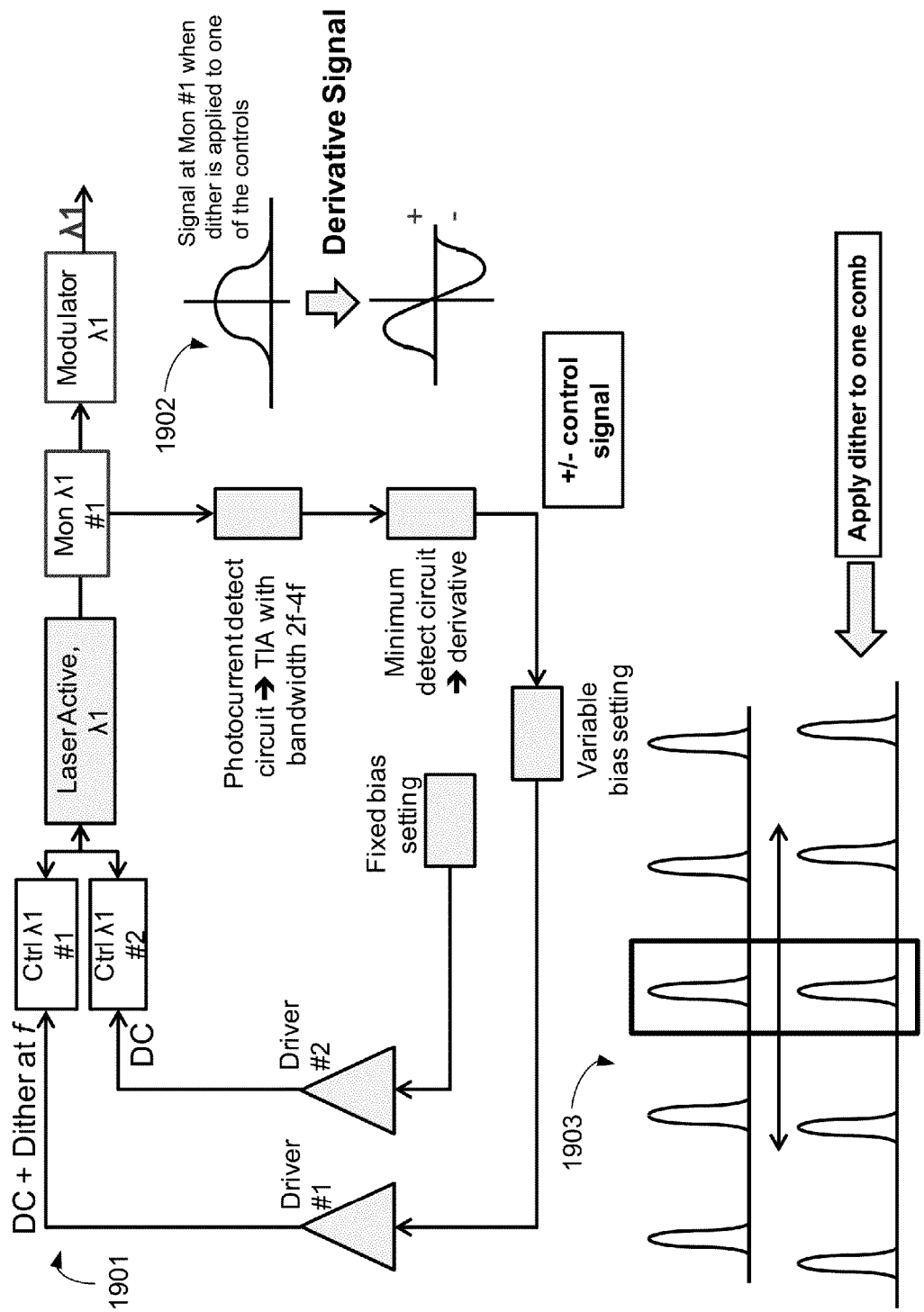
FIG. 19 is a simplified diagram illustrating a wavelength control and locking configuration with a silicon photonic device according to an embodiment of the present invention.

FIG. 19 is a simplified diagram illustrating a wavelength control and locking configuration with a silicon photonic device according to an embodiment of the present invention. As shown, device 1901 shows a laser device coupled to control blocks, and a modulator block. For each wavelength (channel) two control drivers are used. Driver #2 is driven by a fixed DC bias current setting as described as Input 1512 in FIG. 15. Driver #1 is driven by the DC bias current combined a frequency dither signal generated by variable bias block. The both wavelength control signals are combined to drive operation of the laser active region. A monitor device follows the laser active region to monitor the laser power and wavelength by providing feedback signals in terms of current and voltage (e.g., 1523, 1524 in FIG. 15). The monitor block coupled to the modular and laser device is also coupled in series to a photocurrent detect circuit to TIA with bandwidth 2f-4f block, a minimum detect circuit to derivative block, and the variable bias setting block. Only one control signal (e.g., #1) is applied with dither in the monitor device. A photocurrent detect circuit of the monitor device is coupled to a transimpedance amplifier with bandwidth of 2-times to 4-times the corresponding signal frequency. Graph 1902 shows the signal at the monitor #1 block when dither is applied, showing the derivative signal in the bottom graph. The dither-applied control signal after the photocurrent detect circuit further is processed by a minimum detect circuit to convert to a derivative signal. Graph 1903 shows the effect of applying dither to one comb on the wavelengths produced. This self-test configuration can also be used in the detections of the odd harmonics. Accordingly a variable control bias setting is determined and sent back to the laser driver #1. As the wavelength is controlled and locked by the above feedback control configuration, a modulator is coupled before the output port to provide signal modulation (in both amplitude and phase) in accordance with original data bits. Of course, there can be other variations, modifications, and alternatives.

Figure 20:
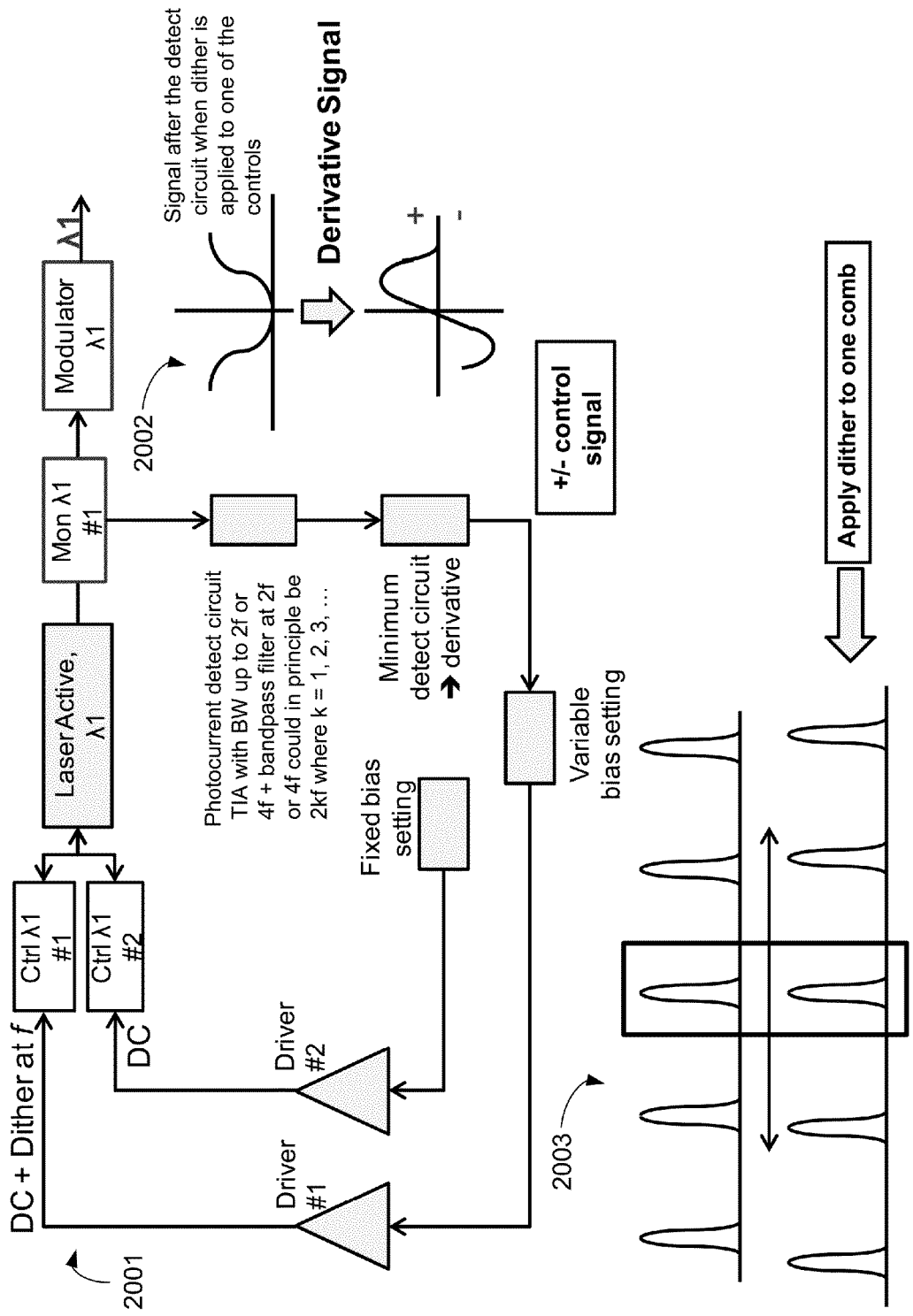
FIG. 20 is a simplified diagram illustrating a wavelength control and locking configuration with a silicon photonics device according to an alternative embodiment of the present invention.

FIG. 20 is a simplified diagram illustrating a wavelength control and locking configuration with a silicon photonics device according to an alternative embodiment of the present invention. The device of 2001 shows a similar configuration to device 1901 of FIG. 19. Graph 2002 shows the signal after the detect circuit when dither is applied to one of the controls. Graph 2003 shows the application of dither to one comb, similar to graph 1903 of FIG. 19. This is a method with some difference added into the transimpedance amplifier for processing the photocurrent detection in the monitor device, wherein the bandwidth of the transimpedance amplifier is still from 2-times (2f) to 4-times (4f) the corresponding signal frequency but a bandpass filter at 2f and 4f (or at 2 kf in principle for k=1, 2, 3, . . . ) is added, compared to the method mentioned in FIG. 19. Again, the dither-applied control signal after the photocurrent detect circuit further is processed by a minimum detect circuit to convert to a reversed derivative signal. Of course, there can be other variations, modifications, and alternatives.

Figure 21A:
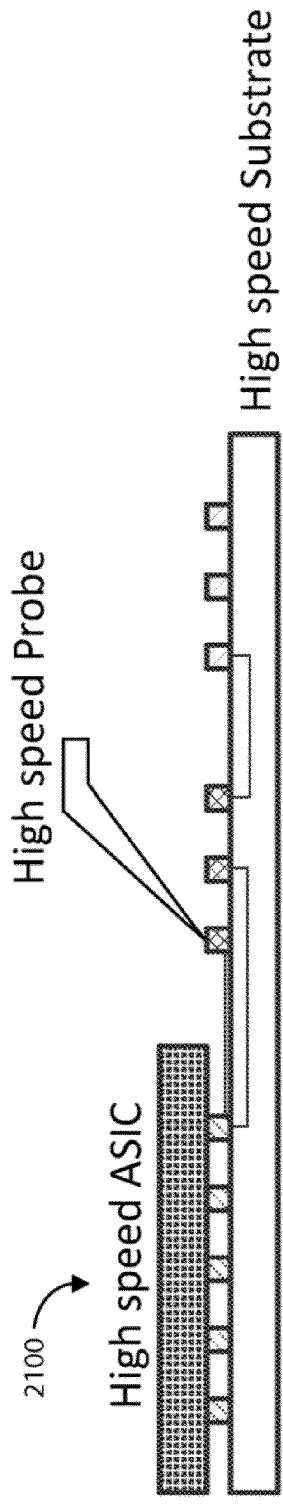
FIGS. 21A-C are simplified diagrams illustrating a silicon photonics device configured on high speed substrates according to embodiments of the present invention.

FIGS. 21 A-C are simplified diagrams illustrating a silicon photonics device configured on high speed substrates according to embodiments of the present invention. FIG. 21A shows device 2101 wherein a high speed ASIC is configured overlying a first region of a high speed substrate and coupled to one or more first contact pads. At least one of the first contacts is coupled to one of one or more second contact pads. Similarly, at least one of the second contacts is coupled to one of one or more third contact pads. A high speed probe is shown at the second contacts.

In an embodiment, the high speed substrate is designed such that it has a series of traces and via connections to characterize its bandwidth and loss. The probe pads may be staggered and/or placed at different distances from the ASIC to characterize the ASIC drive and substrate bandwidth properties. This test can be done in manufacturing to screen out bad ASIC's before the next die is attached. Typically, lower cost dies are screened out before expensive ones. The connections may also be daisy chained on the substrate to test a number of vias and connections in series to extract the equivalent circuit model for each.

Figure 21B:
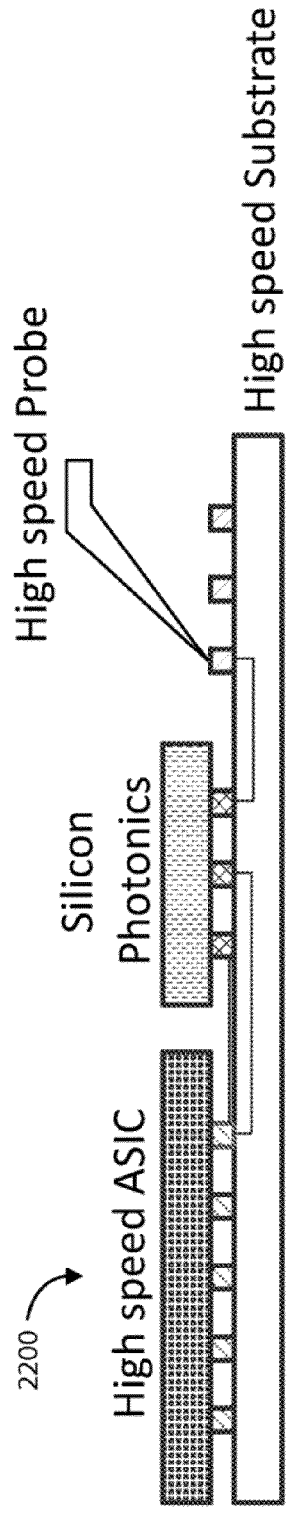

FIG. 21B shows device 2102 wherein a silicon photonics device is configured overlying a second region of the high speed substrate. The silicon photonics device is coupled to the one or more second contacts. The high speed ASIC and the silicon photonics device are coupled via the first and second contacts. Here, the high speed probe is shown at the third contacts.

In an embodiment, the BIST (built-in self-test) capability in the silicon photonics chip can be used to convert the optical signal to the electrical equivalent and test it on the high speed substrate. The high speed substrate can also have resistors, capacitors, etc., for terminations and appropriate electrical loads. In the normal use case, the signals from the silicon photonics device will terminate in the high speed ASIC completely in the self-test loop. There are diagnostic cases where external termination may be provided on the substrate and signal quality is verified.

Figure 21C:
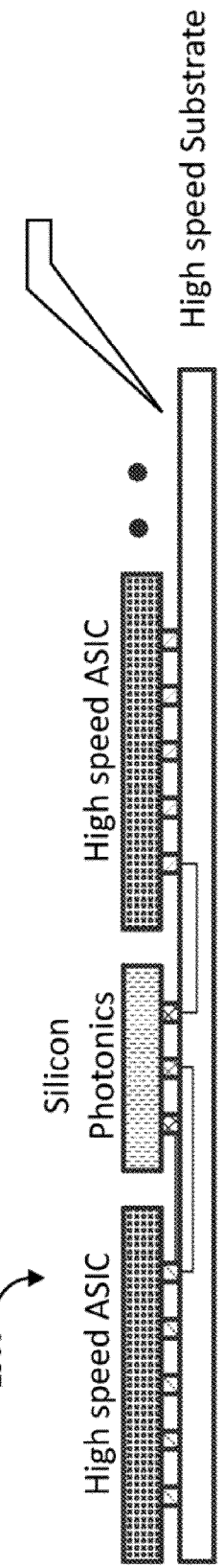

FIG. 21C shows device 2103 wherein another high speed ASIC is configured overlying a third region of the high speed substrate. This second high speed ASIC is coupled to the one or more third contacts. The second high speed ASIC and the silicon photonics device are coupled via the second and third contacts. High speed electrical ASIC and silicon photonics ASIC can be cascaded for testing and characterization.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A monolithically integrated system on chip device, the device comprising:
    a single silicon substrate member;
    a data input/output interface provided on the substrate member and configured for a predefined data rate and protocol;
    an input/output block provided on the substrate member and coupled to the data input/output interface, the input/output block comprising a SerDes block, a CDR block, a compensation block, and an equalizer block;
    a signal processing block provided on the substrate member and coupled to the input/output block, the signal processing block configured to the input/output block using a bi-direction bus in an intermediary protocol;
    a driver module provided on the substrate member and coupled to the signal processing block, the driver module coupled to the signal processing block using a uni-directional multi-lane bus;
    a driver interface provided on the substrate member and coupled to the driver module and configured to be coupled to a silicon photonics device, the driver interface being configured to transmit output data in either an amplitude modulation format or a combination of phase/amplitude modulation format or a phase modulation format;
    a receiver module comprising a TIA block provided on the substrate member and to be coupled to the silicon photonics device using predefined modulation format, and configured to the signal processing block to communicate information to the input/output block for transmission through the data input/output interface;
    a communication block provided on the substrate member and operably coupled to the input/output block, the signal processing block, the driver block, and the receiver block;
    a communication interface coupled to the communication block;
    a control block provided on the substrate member and coupled to the communication block;
    a control interface provided to communicate between the control block and the silicon photonics device, the control interface comprising:
        a modulator bias voltage input;
        a laser DC bias current input;
        a photocurrent or set output;
        a power monitor current/voltage output;
        a photodetector bias input;
        a heater current/voltage input;
        a photocurrent from input signal or set output;
        a wavelength monitor voltage/current/resistance output.

2. The device of claim 1 wherein the signal processing block comprises a FEC block, a digital signal processing block, a framing block, a protocol block, and a redundancy block.

3. The device of claim 1 wherein the driver module is selected from a current drive or a voltage driver.

4. The device of claim 1 wherein the driver module is a differential driver.

5. The device of claim 1 wherein the amplified modulation format is selected from NRZ format or PAM format.

6. The device of claim 1 wherein the phase modulation format is selected from BPSK or nPSK.

7. The device of claim 1 wherein the signal processing block comprises a FEC block, a digital signal processing block, a framing block, a protocol block, and a redundancy block; wherein the amplified modulation format is a PAM format.

8. The device of claim 1 wherein the phase/amplitude modulation is QAM.

9. The device of claim 1 wherein the silicon photonic device is configured to convert the output data into an output transport data in a WDM signal.

10. The device of claim 1 wherein the control block is configured to initiate a laser bias or a modulator bias.

11. The device of claim 1 wherein the control block is configured for laser bias and power control of the silicon photonics device.

12. The device of claim 1 wherein the control block is configured with a thermal tuning or carrier tuning device each of which is configured on the silicon photonics device.

13. The device of claim 1 wherein the SerDes block is configured to convert a first data stream of N into a second data stream of M.

14. A monolithically integrated system on chip device, the device comprising:
    a single silicon substrate member;
    a data input/output interface provided on the substrate member and configured for a predefined data rate and protocol;
    an input/output block provided on the substrate member and coupled to the data input/output interface;
    a signal processing block provided on the substrate member and coupled to the input/output block, the signal processing block configured to the input/output block using a bi-direction bus in an intermediary protocol;
    a driver module provided on the substrate member and coupled to the signal processing block, the driver module coupled to the signal processing block using a uni-directional multi-lane bus;
    a driver interface provided on the substrate member and coupled to the driver module and configured to be coupled to a silicon photonics device, the driver interface being configured to transmit output data in either an amplitude modulation format or a combination of phase/amplitude modulation format or a phase modulation format;
    a receiver module comprising a TIA block provided on the substrate member and to be coupled to the silicon photonics device using predefined modulation format, and configured to the signal processing block to communicate information to the input/output block for transmission through the data input/output interface;

a communication block provided on the substrate member and operably coupled to the input/output block, the signal processing block, the driver block, and the receiver block;
a communication interface coupled to the communication block;
a control block provided on the substrate member and coupled to the communication block;
a control interface provided to communicate between the control block and the silicon photonics device, the control interface comprising:
  a modulator bias voltage input;
  a laser DC bias current input;
  a photocurrent or set output;
  a power monitor current/voltage output;
  a photodetector bias input;
  a heater current/voltage input;
  a photocurrent from input signal or set output;
  a wavelength monitor voltage/current/resistance output.

15. The device of claim 14 wherein the signal processing block comprises a FEC block, a digital signal processing block, a framing block, a protocol block, and a redundancy block; and the input/output block comprising a SerDes block, a CDR block, a compensation block, and an equalizer block; wherein the interface is configured on the silicon photonics device.

16. The device of claim 15 wherein the driver module is selected from a current drive or a voltage driver.

17. The device of claim 15 wherein the driver module is a differential driver.

18. The device of claim 15 wherein the amplified modulation format is selected from NRZ format or PAM format.

19. The device of claim 15 wherein the phase modulation format is selected from BPSK or nPSK.

20. The device of claim 15 wherein the signal processing block comprises a FEC block, a digital signal processing block, a framing block, a protocol block, and a redundancy block; wherein the amplified modulation format is a PAM format.

21. The device of claim 15 wherein the phase/amplitude modulation is QAM.

22. The device of claim 15 wherein the silicon photonic device is configured to convert the output data into an output transport data in a WDM signal.

23. The device of claim 15 wherein the control block is configured to initiate a laser bias or a modulator bias.

24. The device of claim 15 wherein the control block is configured for laser bias and power control of the silicon photonics device.

25. The device of claim 15 wherein the control block is configured with a thermal tuning or carrier tuning device each of which is configured on the silicon photonics device.

26. The device of claim 15 wherein the SerDes block is configured to convert a first data stream of N into a second data stream of M.

* * * * *